United States Patent
Subramanian et al.

(10) Patent No.: US 8,242,778 B2
(45) Date of Patent: Aug. 14, 2012

(54) FAST ELECTRON PARAMAGNETIC RESONANCE IMAGING (EPRI) IN THE CW EPR MODE USING RAPID-SCAN IN THE PRESENCE OF ROTATING GRADIENTS AND DIRECT DETECTION WITH TRANSMIT/RECEIVE AND DATA PROCESSING IN A DIGITAL SIGNAL PROCESSING PLATFORM

(75) Inventors: Sankaran Subramanian, Rockville, MD (US); Nallathamby Devasahayam, Germantown, MD (US); Janusz Koscielniak, Frederick, MD (US); James B. Mitchell, Damascus, MD (US); Murali K. Cherukuri, North Potomac, MD (US)

(73) Assignee: The Government of the United States of America, as represented by the Secretary, Department of Health & Human Services, Washington, DC (US)

( * ) Notice: Subject to any disclaimer, the term of this patent is extended or adjusted under 35 U.S.C. 154(b) by 7 days.

(21) Appl. No.: 12/794,695

(22) Filed: Jun. 4, 2010

(65) Prior Publication Data
US 2011/0109313 A1 May 12, 2011

Related U.S. Application Data

(63) Continuation of application No. 12/564,006, filed on Sep. 21, 2009, now abandoned, which is a continuation-in-part of application No. 12/306,514, filed as application No. PCT/US2007/072371 on Jun. 28, 2007.

(60) Provisional application No. 60/818,052, filed on Jun. 30, 2006.

(51) Int. Cl.
*G01V 3/00* (2006.01)
(52) U.S. Cl. .................................. 324/307; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 6,873,153 | B2 * | 3/2005 | Frydman | 324/307 |
| 7,034,533 | B2 * | 4/2006 | Mugler et al. | 324/318 |
| 7,271,588 | B2 * | 9/2007 | Frydman | 324/318 |
| 7,777,484 | B2 * | 8/2010 | Garwood et al. | 324/307 |
| 7,944,206 | B2 * | 5/2011 | Frydman et al. | 324/307 |
| 8,067,936 | B2 * | 11/2011 | Garwood et al. | 324/307 |
| 2010/0148776 | A1 * | 6/2010 | Subramanian et al. | 324/310 |
| 2010/0253340 | A1 * | 10/2010 | Corum et al. | 324/309 |
| 2010/0253341 | A1 * | 10/2010 | Corum et al. | 324/309 |
| 2011/0050227 | A1 * | 3/2011 | Barrett et al. | 324/310 |
| 2011/0105881 | A1 * | 5/2011 | Kakimoto et al. | 600/407 |
| 2011/0109313 | A1 * | 5/2011 | Subramanian et al. | 324/316 |

\* cited by examiner

*Primary Examiner* — Brij Shrivastav
(74) *Attorney, Agent, or Firm* — Edwards Wildman Palmer LLP; Peter F. Corless; Lisa Swiszcz

(57) ABSTRACT

An electron paramagnetic resonance imaging system that includes means for continuously irradiating a sample with RF irradiation; means for imposing on the sample a sinusoidally varying magnetic field along with rotating gradients for spatial encoding; means for directly detecting signal data from the sample, without using field modulation, while irradiating the sample with RF radiation continuously, the means for directly detecting having means for sweeping the sinusoidally varying magnetic field; and means for transmitting, receiving and processing the signal data, using means including a digital signal processor.

22 Claims, 22 Drawing Sheets

B0 matrix. Elements are collected row-wise in conventional EPR imaging and columnwise in rotating-gradient stepped-field data collection.

The horizontal direction represents the field sweep and the vertical direction represents the gradient rotation through 360 deg. The top half of the matrix contains the full information.

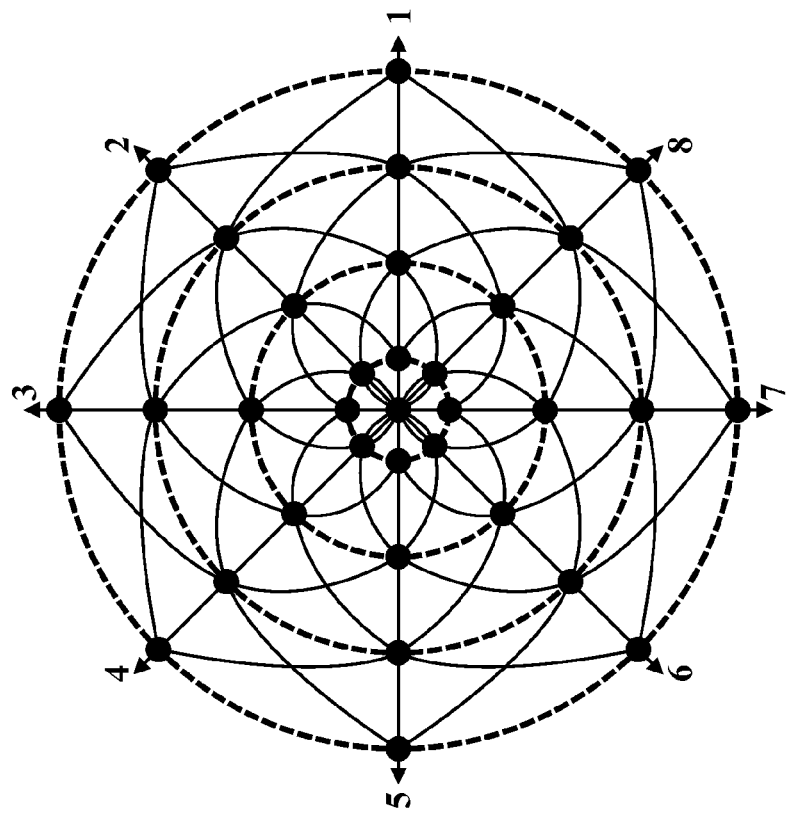

FIG. 8

Mnemonic representation of the way we collect the elements of the Bq matrix for CW EPR imaging. The diagonal double-headed arrows (1-5, 2-6, 3-7, 4-8, 5-1, 6-2, 7-3, 8-4) represent conventional projection data collection, with 8 sweeps (B1 to B8) each with constant gradient orientation θ1 to q 8. The dotted circles represent the stepped-field-rotating-gradient modality, and the Kaleidoscopic pattern (continuous lines) represent the Rapid scan rotating gradient strategy.

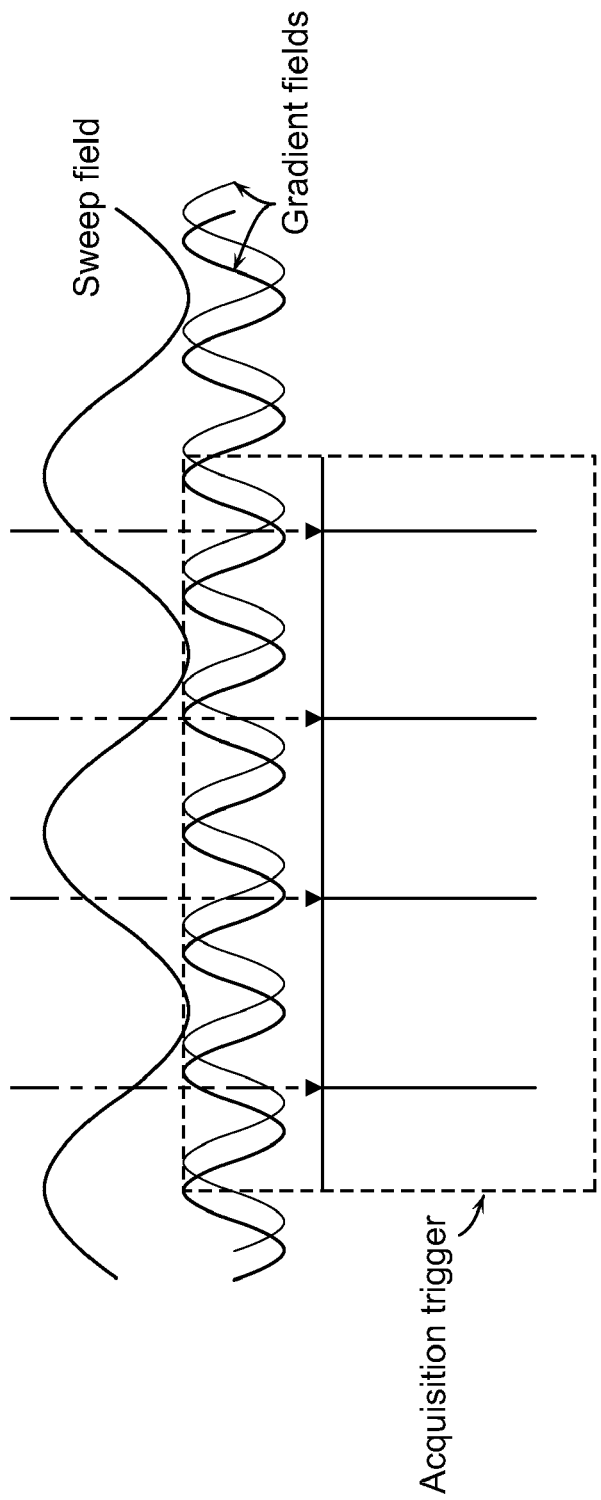

Direct detected absorption EPR signals of a phantom sample in the absence of gradients. The top sinusoid represents the rapid scan sweep, and the two high frequency sinusoids (blue and red) represent the x and z gradients, which together provide the rotating gradient in the xz plane. The left side of the dotted rectangle represents the start of the trigger. 25000 samples at 4 Ms/s were collected for each gradient phase setting, giving rise to two downfield scans (first and the third spectrum) and two up field scans (second and the fourth spectrum).

FIG. 9

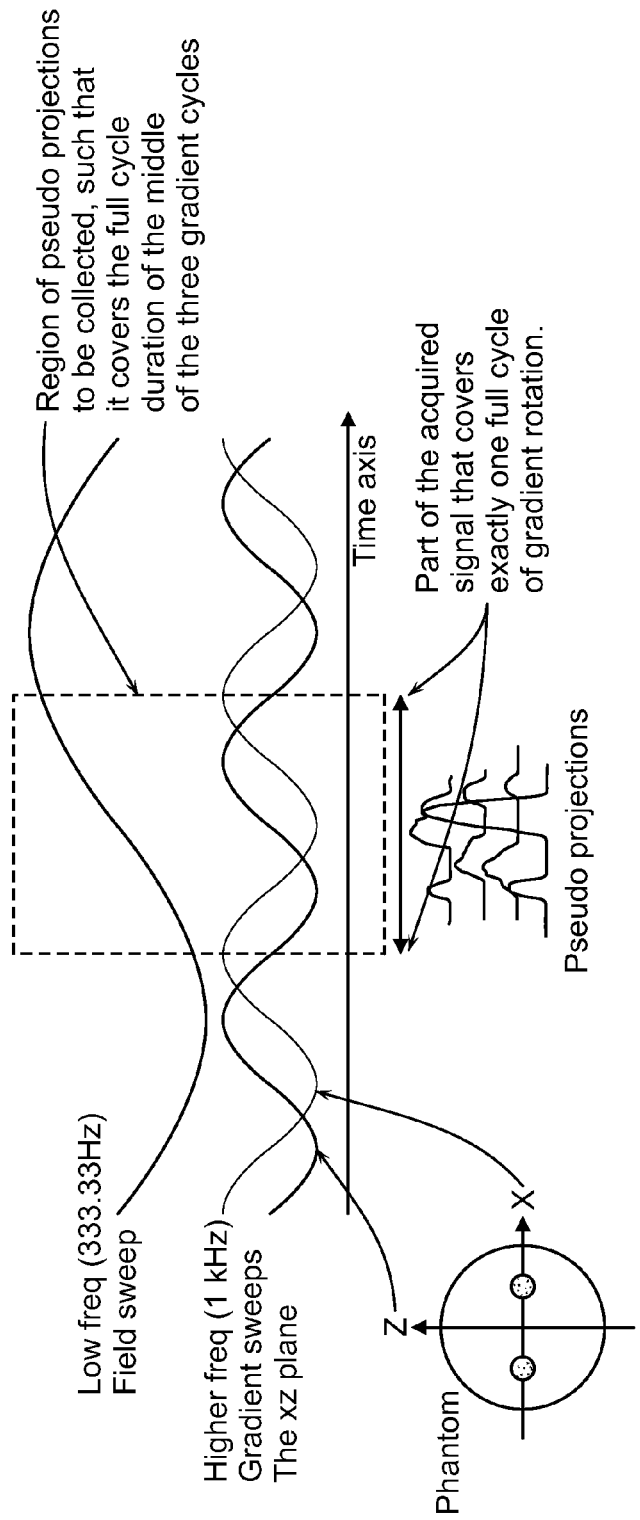

FIG. 10

Schematics of the rotating-gradient / rapid-scan pseudo-projection collection carried out an a two-tube TCNQ phantom. The field scan frequency was 333.33 Hz and the gradient rotation frequency was 1 kHz. The sampling frequency was 4 Ms/s and 25000 points were collected. 4000 samples corresponding one of the full cycles of the gradient rotations for an up field sweep constitutes a pseudo projection parallel to the diagonal of the Bq matrix. A few pseudo projections are shown.

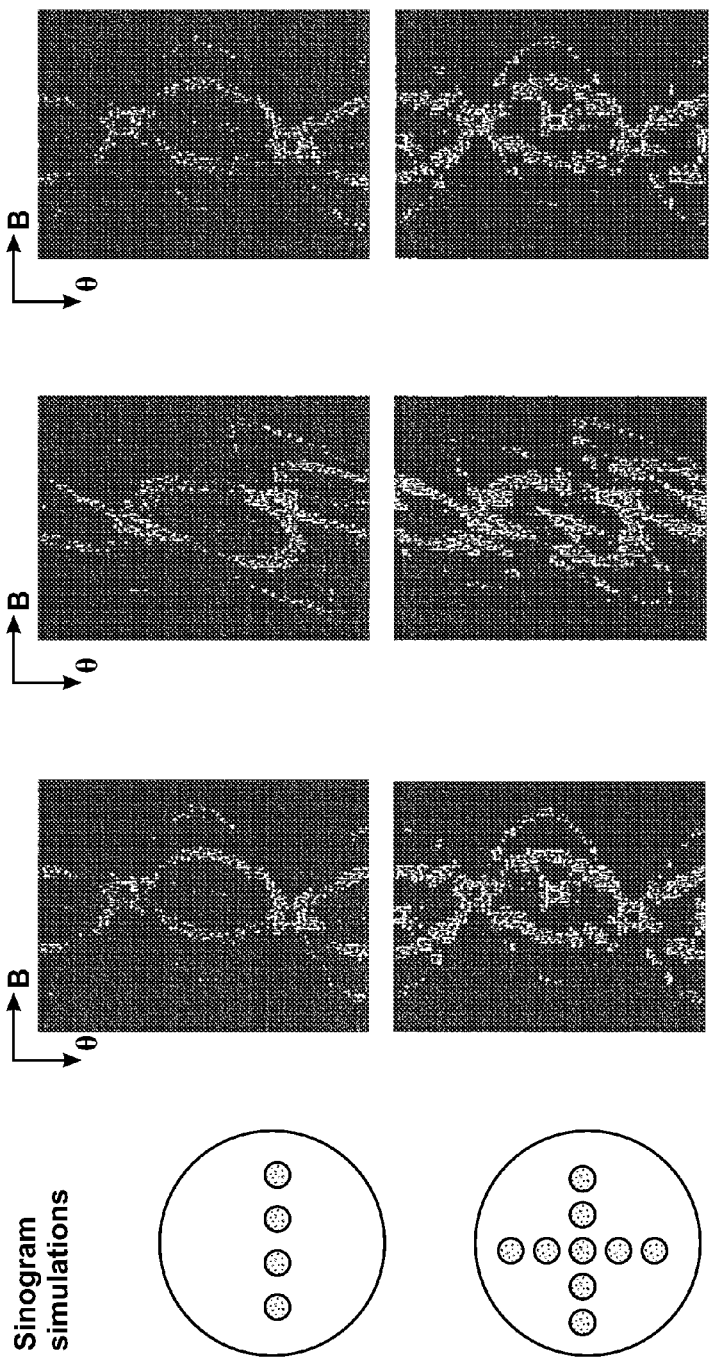

FIG. 12

Top Row: Phantom consisting of 5 cylindrical tubes with spin projected on to the plane of the paper, and the corresponding conventional static gradient sinogram (left), rapid scan rotating gradient pseudo sinogram (middle) and the back-converted correct sinogram (left).

Bottom Row: A 9-tube phantom arranged as a + symbo. The conventional static gradient sinogram (left), pseudo sinogram from rapid scan rotating gradient modality (middle), and the back-converted sinogram (right).

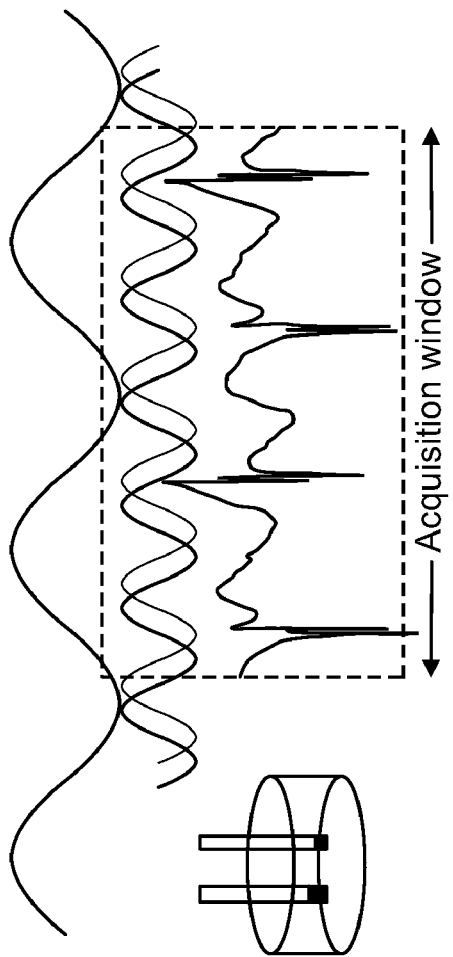

FIG. 13

Actual experimental results for simultaneous rapid scan and rotating gradients. The top low frequency signal (333.33 Hz) correspond to the AC scan superimposed on the Zeeman field and the red and blue higher frequency signals (1000Hz) represent the x and y gradient inputs that generate the rotating gradient in the xy plane. The phantom consisted of two TCNQ tubes as shown and 25000 data points at a sampling rate of 4 Ms/s led to the collection of four pseudo projections two for up field and two for downfield sweeps. The baseline rolling is due to gradient induced oscillatory currents picked upthe resonator. These can be easily removed by numerical corrections.

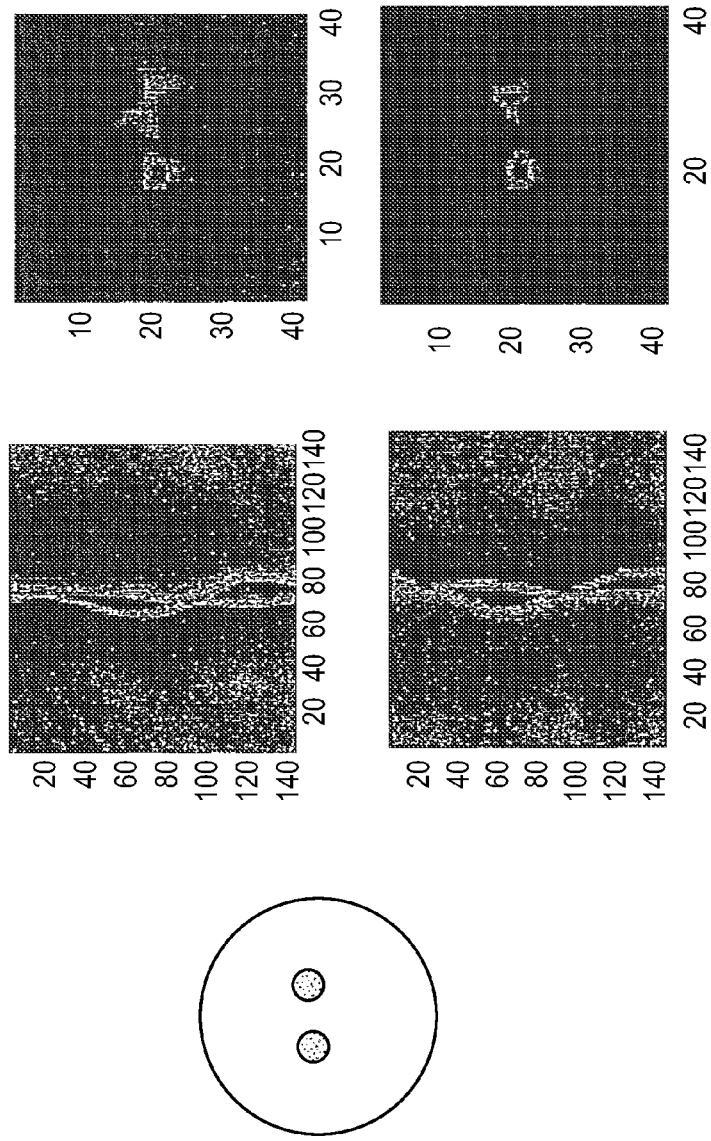

FIG. 14

Top Row: Pseudo sinogram and the pseudo image obtained by back-projecting the raw rapid scan rotating gradient data for a 2-tube phantom (shown on the left). As expected the image obtained is not the correct one.

Bottom Row: Matrix swapped assuming the correct direction of the field sweep. The sinogram and the image are the correct ones. (independently verified by performing the conventional static gradient CW imaging)

Pseudo projections were matrix-shuffled to give the correct projections and back projected to give the correct image.

Rapid scan (0.33 kHz) and rotating gradient (1 kHz) pseudo projections back projected leading to the pseudo image.

A six-tube phantom consisting of 2mM triarylmethyl in saline ranging from 400 to 500 μL in volume.

ized spectroscopic technique. Spectroscopy refers to the branch of analysis used for identifying elements and compounds and elucidating atomic and molecular structure by measuring the radiant energy absorbed or emitted by a substance at characteristic wavelengths of the electromagnetic spectrum (including gamma ray, X ray, ultraviolet, visible light, infrared, microwave and radio-frequency radiation) in response to excitation by an external energy source. The instruments used are spectroscopes (for direct visual observation) or spectrographs (for recording spectra). Spectroscopic systems include a radiation source, detectors, devices for measuring wavelengths and intensities, and interpretation of measured quantities to identify chemical identifications or give clues to the structure of atoms or molecules. Various specialized spectroscopy techniques include Raman spectroscopy, nuclear magnetic resonance (NMR), nuclear quadrupole resonance, dynamic reflectance spectroscopy, microwave and gamma ray spectroscopy, and electron spin resonance (ESR) spectroscopy or its synonym, electron paramagnetic resonance (EPR) spectroscopy.

FAST ELECTRON PARAMAGNETIC RESONANCE IMAGING (EPRI) IN THE CW EPR MODE USING RAPID-SCAN IN THE PRESENCE OF ROTATING GRADIENTS AND DIRECT DETECTION WITH TRANSMIT/RECEIVE AND DATA PROCESSING IN A DIGITAL SIGNAL PROCESSING PLATFORM

CROSS-REFERENCES TO RELATED APPLICATIONS

This patent application is a Continuation of U.S. application Ser. No. 12/564,006, filed Sep. 21, 2009, which is a Continuation-in-Part patent application of U.S. application Ser. No. 12/306,514, filed Dec. 23, 2008 as a U.S. National Phase of PCT/US2007/072371, filed Jun. 28, 2007, which claims the benefit of priority from U.S. Provisional Application No. 60/818,052, filed on Jun. 30, 2006, all of applications which are incorporated by reference herein in their entirety.

STATEMENT AS TO RIGHTS TO INVENTIONS MADE UNDER FEDERALLY SPONSORED RESEARCH AND DEVELOPMENT

A part of this invention was made with Government support under a contract awarded by the Department of Health and Human Services, National. Institutes of Health. The Government has certain rights to this invention.

BACKGROUND OF THE INVENTION

The present invention is related to a specialized spectroscopic technique. Spectroscopy refers to the branch of analysis used for identifying elements and compounds and elucidating atomic and molecular structure by measuring the radiant energy absorbed or emitted by a substance at characteristic wavelengths of the electromagnetic spectrum (including gamma ray, X ray, ultraviolet, visible light, infrared, microwave and radio-frequency radiation) in response to excitation by an external energy source. The instruments used are spectroscopes (for direct visual observation) or spectrographs (for recording spectra). Spectroscopic systems include a radiation source, detectors, devices for measuring wavelengths and intensities, and interpretation of measured quantities to identify chemical identifications or give clues to the structure of atoms or molecules. Various specialized spectroscopy techniques include Raman spectroscopy, nuclear magnetic resonance (NMR), nuclear quadrupole resonance, dynamic reflectance spectroscopy, microwave and gamma ray spectroscopy, and electron spin resonance (ESR) spectroscopy or its synonym, electron paramagnetic resonance (EPR) spectroscopy.

Electron Paramagnetic Resonance is a spectroscopic analysis technique used to identify paramagnetic substances and investigate the nature of bonding within molecules by identifying unpaired electrons and their interaction with their immediate surroundings. Unpaired electrons, because of their spin, behave like tiny magnets and can be lined up in an applied magnetic field. Energy applied by alternating microwave radiation is absorbed when its frequency coincides with that of the precession of the electron magnets in the sample. Precession refers to a change in the direction of the axis of a rotating body; the motion of a spinning body (e.g., as a top) in which it wobbles so that the axis of rotation sweeps out a cone. The obtained graph or spectrum of radiation absorbed as the field changes gives information valuable in chemistry, biology, and medicine.

Electron Paramagnetic Resonance (EPR) is a spectroscopic technique similar to Nuclear Magnetic Resonance (NMR). NMR is also known as magnetic resonance imaging (MRI). While NMR spectroscopy detects species containing magnetic nuclei such as H1, $^{13}C$, $^{19}F$, EPR spectroscopy detects species with unpaired electrons. Examples of species with unpaired electrons are transition metal ions and free radicals. Magnetic Resonance Imaging (MRI) employs magnetic field gradients to generate anatomic images from objects abundant with water protons. The contrast agent induced spectral changes such as changes in spin-lattice relaxation (T1) and spin-spin relaxation (T2) times of protons provide functional information.

Recently available biologically compatible free radical contrast agents have made in vivo EPR imaging possible. The spectral changes in EPR are much more sensitive to the changes in the local environment than in MRI, making EPR imaging a potentially useful and complementary imaging technique to MRI.

In EPR, the object is irradiated with weak RF radiation continuously while sweeping the magnetic field relatively slowly, a technique known as CW EPR. Existing CW methodologies involve using a constant vector field gradient, a relatively slow sweep of magnetic field and the use of field modulation, a signal detection method known as phase-sensitive detection. This method takes typically at least 1-2 sec. for taking a single projection. However, most EPR imaging modalities use phase sensitive detection, which mandates several scans which are slow (seconds) making the image data acquisition times unacceptably long (e.g., 30 minutes) for in vivo applications.

Several EPR techniques are known. For example, U.S. Pat. No. 6,504,367, entitled "Electronic paramagnetic resonance imaging device using high amplitude modulator," shows a conventional field sweep method using a field modulator along with phase sensitive detection. This reference does not teach or suggest the use of a direct detection scheme.

U.S. Pat. No. 6,472,874, entitled "EPR imaging device using microwave bridge translator," describes a device which permits the acquisition of electron paramagnetic resonance images without employing additional hardware for generation of magnetic field gradients. It incorporates a module for translation of the bridge-circulator-resonator-detector assembly in order to locate the resonator at an optimal off-center position in the magnet and employs the inherent gradient in the magnetic field, permitting operation in either the continuous wave or pulsed mode. This reference shows a conventional field sweep method using a field modulator along with phase sensitive detection. This reference does not teach or suggest the use of a direct detection scheme.

U.S. Pat. No. 6,101,015, entitled "Variable-coupling quasioptical electron resonance apparatus," describes a variable-coupling quasioptical electron paramagnetic resonance apparatus. This reference does not teach or suggest CW EPR, nor does it teach or suggest a direct detection modality, nor rotating magnetic fields.

U.S. Pat. No. 6,046,586, entitled "Crossed-loop resonator structure for spectroscopy," describes a resonator structure including a first resonator having a first resonator loop formed by a hollow channel with conductive walls and a second resonator having a second resonator loop formed by a hollow channel with conductive walls. The detector circuit of the '586 patent detects the high frequency energy in the second resonator loop and supplies the detected signal for subsequent analysis. This reference teaches away from the use of CW in EPR.

Several other United Stated Public Health Service patents including: U.S. Pat. Nos. 5,387,867; 5,502,386; 5,828,216; 5,865,746; and 6,573,720 are also related to EPR modalities. However, none of these patent references disclose a CW EPR modality. All these references describe a conventional field sweep method using field modulation along with phase sensitive detection, and some are related to pulse mode as opposed to CW EPR imaging.

With regard to direction detection modalities, it is recognized that while direct detection may be known, it is not used with CW EPRI.

With regard to rotating magnetic field gradients, a reference by Ohno et al. (e.g. see Ohno et al., Electron Paramagnetic Resonance Imaging Using Magnetic-Field-Gradient Spinning, Journal of Magnetic Resonance 143:274-279 (2000)), and a reference by Deng et al. (e.g. see Fast EPR imaging at 300 MHz using spinning magnetic field gradients, Journal of Magnetic Resonance 168:220-227 (2004)) disclose sinusoidal/rotating magnetic field sweep in general, but not with direct detection. These references describe EPR modalities using low frequency modulation and relatively slow field scans, i.e., not with direct detection CW EPRI. Both of these references describe the use of field modulation and phase sensitive detection, which are the conventional ways of performing EPR and do not allow very fast field sweeps.

The use of a digital signal processor (DSP) is known in other signal processing areas. However, the use of a DSP in combination with (1) direct detection in the CW EPRI setup, allowing for faster scans; and (2) sinusoidal magnetic field sweep data acquisition under gradient magnetic fields, and rotating gradients is not yet known.

There is therefore a need for an EPR modality that does not suffer from the above shortcomings.

BRIEF SUMMARY OF THE INVENTION

The present invention is directed to an EPR modality that provides for a combination of direct-detection strategies, by mixing the acquired signals with the base-band signal and acquiring the data with a fast-digitizer; the acquisition of projection data using sinusoidal/rotating magnetic field sweep under gradient magnetic fields; and the implementation of digital signal processing (DSP) techniques, which eliminate several sources of noise originating from analog devices in the spectrometer.

In one embodiment, the present invention provides an electron paramagnetic resonance imaging system. The system includes means for continuously irradiating a sample with RF irradiation; means for imposing on the sample a sinusoidally varying magnetic field along with rotating gradients for spatial encoding; means for directly detecting signal data from the sample, without using field modulation, while irradiating the sample with RF radiation continuously, the means for directly detecting having means for sweeping the sinusoidally varying magnetic field; and means for processing the signal data, using means including a digital signal processor.

In one embodiment, the electron paramagnetic resonance imaging system also includes a digital gradients and sweep controller operationally coupled with the means for imposing on the sample a sinusoidally varying magnetic field along with rotating gradients for spatial encoding, the means for directly detecting signal data from the sample, and the means for processing the signal data. The digital gradients and sweep controller is configured to automatically maintain the relative speeds for the sweep current and the gradient currents and adjust the timing for detecting signal data.

In one aspect, the digital gradients and sweep controller comprises a Field Programmable Gate Array (FPGA) integrated circuit. The circuit can be configured to produce a plurality of sinusoidal voltages which are used to drive a respective plurality of current amplifiers to control currents in the gradient and sweep coils of the imaging magnets of the electron paramagnetic resonance imaging system.

In another embodiment, the means for processing the signal data is configured to collect signal data including projection data and perform two-dimensional back projection to display the image data.

In another embodiment, the means for processing the signal data is configured to collect signal data including projection data and perform three-dimensional back projection to display a slice of image data.

In another embodiment, the means for processing the signal data is configured to acquire waveforms in real-time, and wherein the digital signal processor is configured for filtering and averaging the acquired waveforms. In one aspect, the means for processing the signal data includes a Field Programmable Gate Array (FPGA) integrated circuit.

For a further understanding of the nature and advantages of the invention, reference should be made to the following description taken in conjunction with the accompanying drawings.

BRIEF DESCRIPTION OF THE DRAWINGS

FIG. 8 is a simplified exemplary schematic diagram of the collection of data elements for the CW EPR modality in accordance with one embodiment of the present invention.

FIG. 9 is a simplified exemplary diagram of two full cycle gradient sweeps.

FIG. 10 is a simplified exemplary diagram of the rotating gradient/rapid scan pseudo projection data collection of a two-tube TCNQ phantom in accordance with one embodiment of the present invention.

FIG. 12 shows simulated exemplary projections.

FIGS. 13-15 show results obtained on the phantoms.

DETAILED DESCRIPTION OF THE INVENTION

Figure 1:
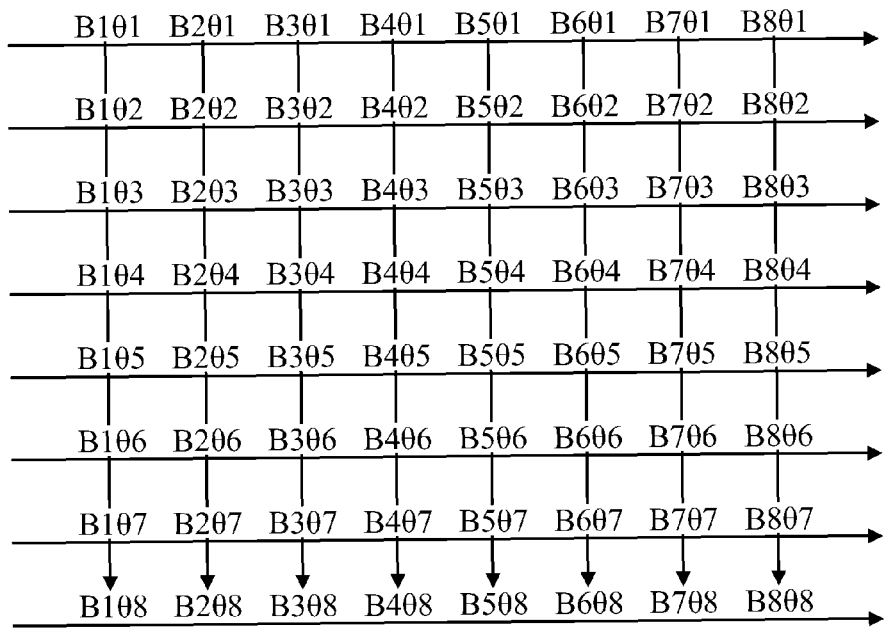
FIG. 1 is an exemplary diagram of the field-sweep vs. gradient rotation matrix data collected in conventional EPR imaging.

The embodiments of the present invention incorporate several approaches to collect image data in an electron paramagnetic resonance spectrometer with increased spatial, temporal, and spectral resolution and improved sensitivity. The spectral data acquisition is accomplished by direct-detection strategies by mixing the signals to the base-band and acquiring the data with a fast-digitizer. The projection data is acquired using sinusoidal magnetic field sweep under gradient magnetic fields. Additionally, employing rotating gradients, the image data collection times can be kept below 1 second. The sensitivity improvements are accomplished by implementing digital signal processing (DSP) techniques, which eliminate several sources of noise originating from analog devices in the spectrometer. The direct detection imaging modality does not need to use field modulation or phase-sensitive detection.

Introduction

In vivo EPR imaging can quantitatively provide important physiological information such as the pharmacokinetics of free radical probes, the concentration of oxygen, the redox status of tissue, etc. The oxygen status of tissue is very important in cancer treatment with chemotherapy or radiation, and the study of redox status of tissue will help in our understanding of oxidative stress, and such other aspects as tissue viability for transplant and wound-healing. Since in situ free radicals are at very low concentrations and are short-lived, in vivo EPR imaging may require the introduction, via intravenous or intramuscular injection or implantation, of stable non-toxic free radical spin probes into the animal. Stable nitroxides and triarylmethyl radicals (TAMs) are being routinely used in this regard. To study oxygen concentration in predetermined locations, particulate spin probes with oxygen sensitive line widths such as fusinite, carbon chars and Lithium phtahlocyanine crystals have been employed. The very low penetration of microwave (MW) frequency radiation employed in the conventional EPR spectroscopy has prompted in vivo measurements to be carried out more and more in the radio frequency (RF) region. Both pulsed and CW methods have been developed for the purpose of small animal functional EPR imaging. The main thrust in the case of pulsed EPR imaging has been to perform rapid imaging with high temporal resolution that allows follow up dynamic changes in redox status and/or oxygen status as a function of treatment procedures. The very short transverse relaxation times, T2 (large line widths) of common stable free radicals such as nitroxides do not easily permit them to be studied using time-domain spectroscopy. They are however amenable for study by CW EPR, but then, the relatively slow scan rates of the field necessitated by the conventional low frequency field modulation and phase sensitive detection method makes the imaging time quite long, especially if one is performing spectral spatial imaging. Prolonged imaging time leads to errors in quantitative assessment of spin distribution and asymmetry due to changing spin concentration brought about by metabolic redox reactions, dynamic distribution, as well as simple renal elimination.

The embodiments of the present invention are directed towards a method that can provide a way out of this bottleneck and allow one to perform very rapid CW EPR imaging that would widen the scope of EPR imaging with improved temporal resolution, and concomitantly provide for more accurate pharmacokinetic and asymmetry data. Aspects of the present invention are described in a paper by Subramanian et al. entitled "A new strategy for fast radiofrequency CW EPR imaging: Direct detection with rapid scan and rotating gradients," Journal of Magnetic Resonance 186 (2007) 212-219, the entirety of which is incorporated herein by reference for all purposes.

In conventional CW EPR imaging the number of equally spaced vector orientations of the space encoding gradients between 0° and 180° (for 2D imaging, for example) in a polar raster are decided upon, and for each gradient orientation the Zeeman field is swept through the entire spectral region. This leads to a finite number of projections from which the image is reconstructed by filtered back projection, which is known in computed tomography, CT. Alternate methods have been suggested in which the Zeeman field is swept through the entire field region in finite number of steps, and within each field step, the gradient is rotated in a polar raster through 360°. Each gradient step can be repeated several times and the results coherently added for improved signal-to-noise ratio (SNR) via signal averaging.

Unlike the conventional collection mode, in the rotating gradient procedure, the gradient has to be rotated several times (64 or 128 times, for example) for each field sweep. The resulting digitized data has to be re-organized to provide the conventional projections which are then back-projected to reconstruct the image. This basic rotating gradient method of measurement uses low frequency modulation and phase-sensitive detection with a lock-in amplifier and hence the field sweep cannot be arbitrarily fast.

For very fast field scans, a sinusoidal (AC) or a triangular magnetic field that is superimposed on the static Zeeman field is used, and by using large amplitudes (10-20 G) at frequencies in the 10-20 kHz region, scan rates on the order of 10 to 20 T/s and cover sweep widths of 10-20 G in times on the order of microseconds can be accomplished. By adjusting the Zeeman field one can make the resonances to occur in the linear region of the sinusoidal fast sweep, and can perform very rapid scan EPR spectroscopy and imaging. Low frequency field modulation and phase sensitive detection cannot be used with such a rapid scan. In this modality, ultra fast scans that pass the spectral width in times on the order of transverse relaxation times will cause distortions and in the limit of very fast scans produce 'ringing' at the trailing edge of the spectrum, similar to the free induction decay of spins in response to pulsed excitation. While it may not be necessary to scan at such great speeds, it is rather easy to remove the ringing pattern and correct the line shape by known Fourier deconvolution techniques commonly used in rapid scan correlation NMR and EPR spectroscopy.

CW EPR Imaging with Rapid Scan of the Magnetic Field and Rotating Gradients

The embodiments of the present invention provide method for rapid scan rotating gradient CW EPR imaging (RSRG_CW_EPRI). The method and systems in accordance with the embodiments of the present invention also incorporate digital signal processing techniques that for faster data acquisition and improved SNR.

Experimental

CW EPR imaging can be carried with a constant gradient to produce a mapping of the unpaired spin probe distribution in one, two or three dimensions. The conventional method of imaging is to collect projections of the object in the presence of an equally distributed orientation of a constant gradient applied in a polar coordinate raster centered about the object, and generate a series of projections. Each projection is the sum of the line integrals of the spin density distribution along lines perpendicular to the gradient axis, and constitute a profile or projection. Projections for gradients separated by 180° are identical, since interchanging the sample and the gradient directions does not affect the projection profile. These projections can be suitably filtered and back-projected to produce the 2D image of the object. 3D imaging can be carried out in a similar fashion, by collecting a series projections during which the gradient is rotated in equal steps along polar and azimuthal rasters in a looped fashion, both varying from 0-180°. The reconstruction can be carried out by a two step process involving three dimensional filter functions. When it is desired to generate additional spectral information in addition to spatial distribution of spins in the object, then the so-called spectral-spatial imaging is performed, in which the additional virtual spectral dimension is created by a further variation in the magnitude of the space encoding gradient.

The methods and systems in accordance with the embodiments of the present invention are focused on the modality for obtaining the projections in a fast imaging initiative that can help generate functional EPR images (both the spin distribution and physiological information such as in vivo oxygen concentration) with superior spatial and temporal resolution. To better understand the relationship between the main strategies of CW EPR imaging, the elements in each projection profile are considered below. For a two dimensional polar raster of the gradient, the gradient vector is rotated from an arbitrary starting angle of 0° through 180°-θ, in steps of θ. For each value of the gradient angle the projections are collected. For simplicity, it is assumed that there are eight gradient orientations (θ1 to θ8) and the projections are represented by 8 field positions (B1 to B8). It should be recognized that the embodiments of the present invention are not limited to the eight exemplary gradient orientations and projections. The eight projections that will result from the 2D experiment will constitute a Bθ matrix of dimension 8×8. The rows represent the field values increasing from Bmin to Bmax from left to right, and let the columns represent the gradient orientations from 0 to 360°-θ, in steps of (360/8)°, from top to bottom, as shown in FIG. 1.

In the conventional CW imaging mode, the collection of the projections is followed by sweeping the field at constant gradient, and then the gradient vector is sequentially reoriented in a polar grid through equal intervals. In other words, the elements of the Bθ matrix are determined row-wise. This is indicated by the horizontal arrows in FIG. 2. In rapid scan EPR imaging the imaging mode is the same, except that the scan rates are very high (and the projections are subsequently deconvoluted to get rid of the distortion introduced by the ringing), and as such the horizontal arrows represent rapid scan CW EPR modality as well. The vertical arrows, on the other hand, correspond to filling the Bθ matrix column-wise and represent the determination of the elements by scanning the field in a stepwise fashion, with the gradients being completely rotated from 0-360°. Here the field will be incremented from start to end in a finite number of steps (eight in this simplified example) and the gradient will go from 0 to 360° in 8 θ-steps. It could be rotated fully through 0 to 360° and the results from 180 to 360-θ can be added to those from 0 to (180-θ), because of the inversion symmetry of the projections. When eight data points are collected as a function of the gradient rotation from 0 to 360-θ, per field position, they will constitute the first point in the eight conventional projections, and, the eight data points in the second field position will constitute the second points in the eight conventional projections and so on. The number of projections in general will depend on the number of data samples acquired for a full rotation of the gradients, and the number of points digitally representing each projection will be the number of total field points from start to end. The rotating gradient CW imaging scheme is schematically represented in FIG. 2.

Figure 2:
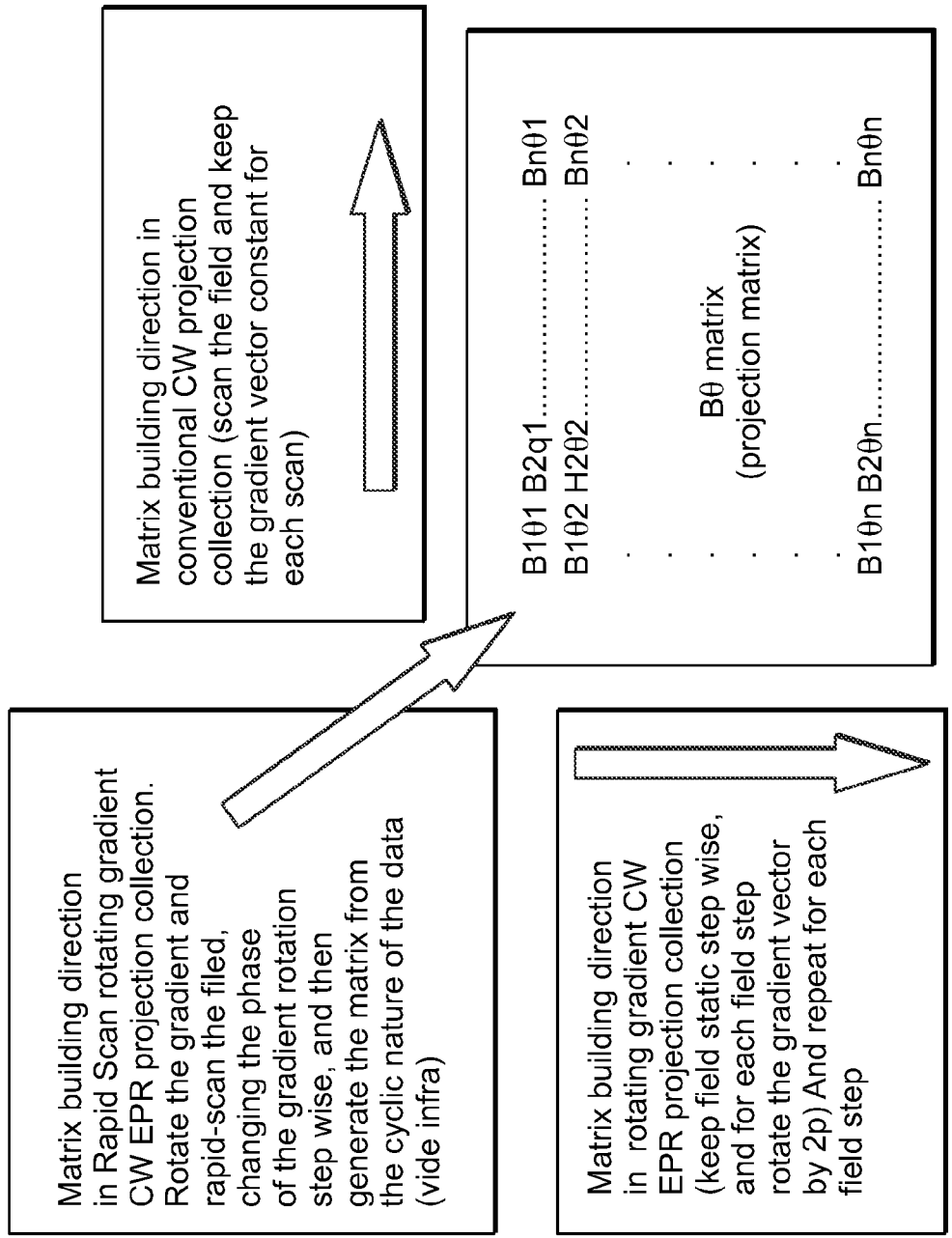
FIG. 2 is an exemplary diagram of the data collection for the field-sweep vs. gradient rotation matrix in accordance with one embodiment of the present invention.
Figure 3:
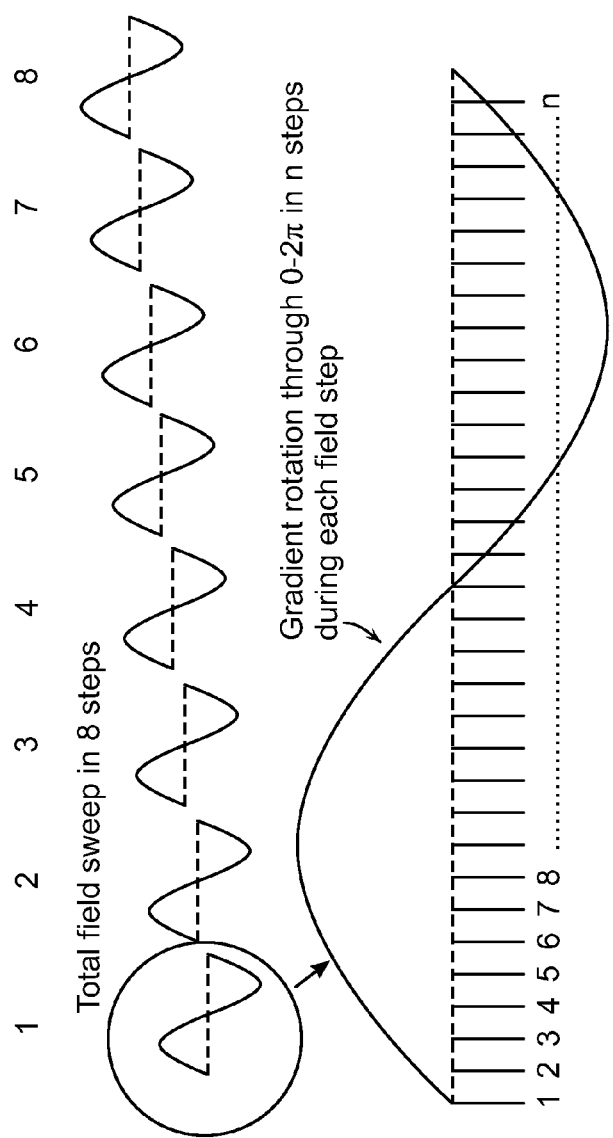
FIGS. 3-4 are simplified schematic diagrams of a stepped-field rotating gradient 2D CW EPR.
Figure 4:
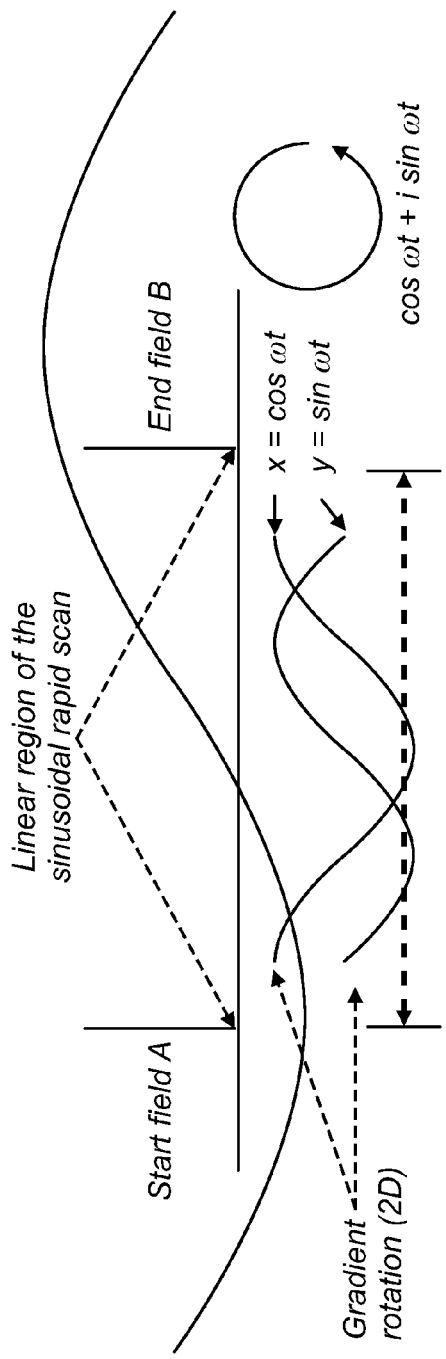
Figure 5:
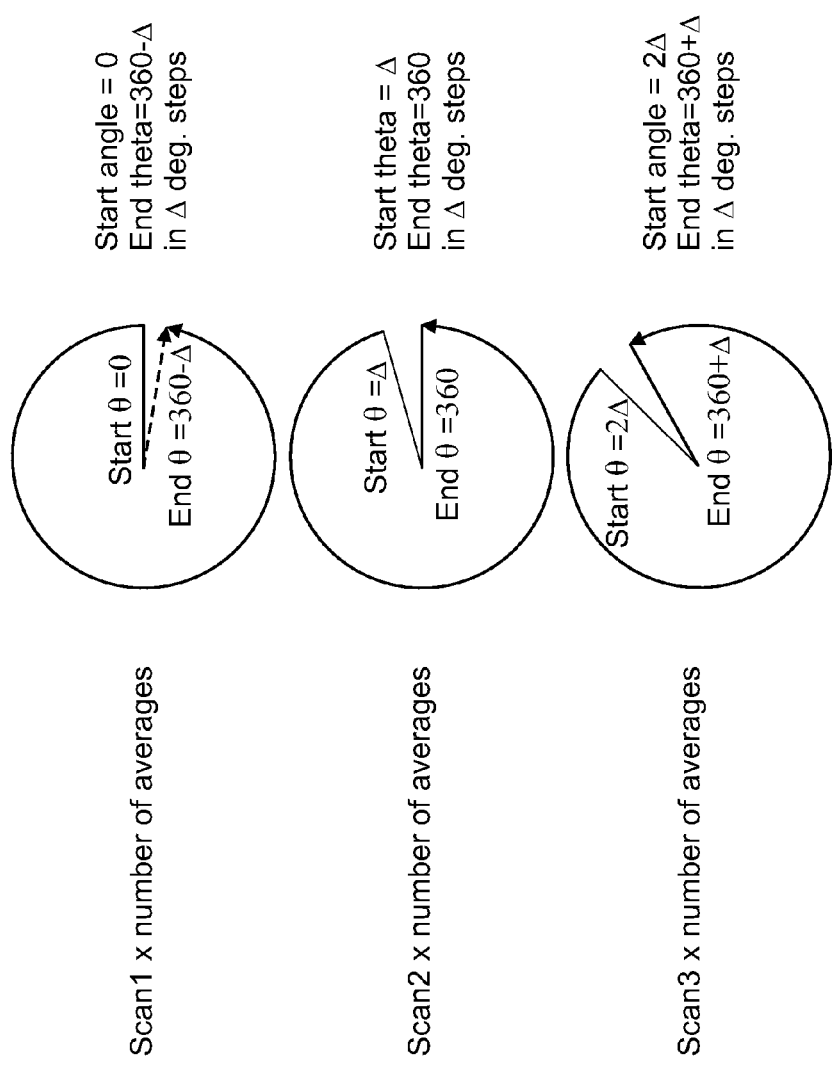
FIG. 5 is an exemplary diagram of the sequential shifting of the phase of the rotating gradients.
Figure 6A:
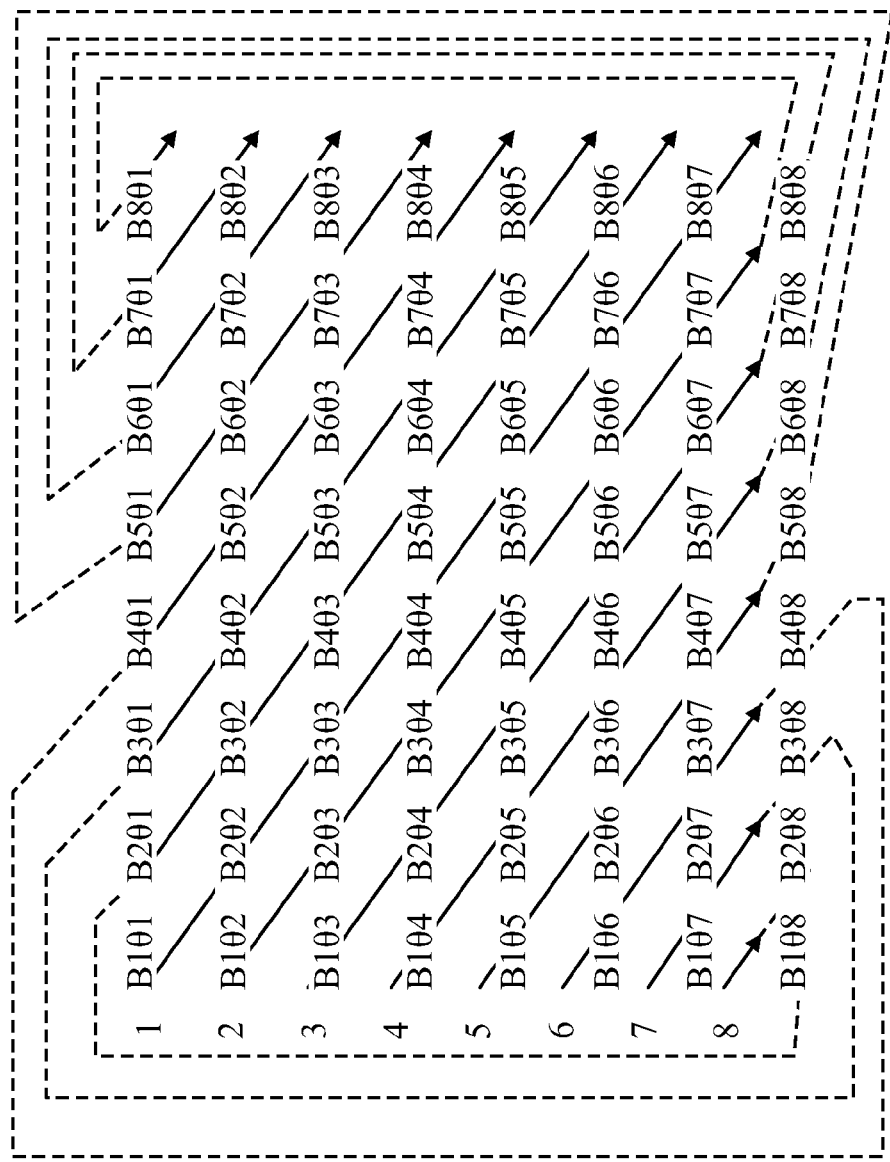
FIGS. 6A and 6B are simplified exemplary schematic diagrams of the diagonal data collection for the field-sweep vs. gradient rotation matrix in accordance with one embodiment of the present invention.
Figure 6B:
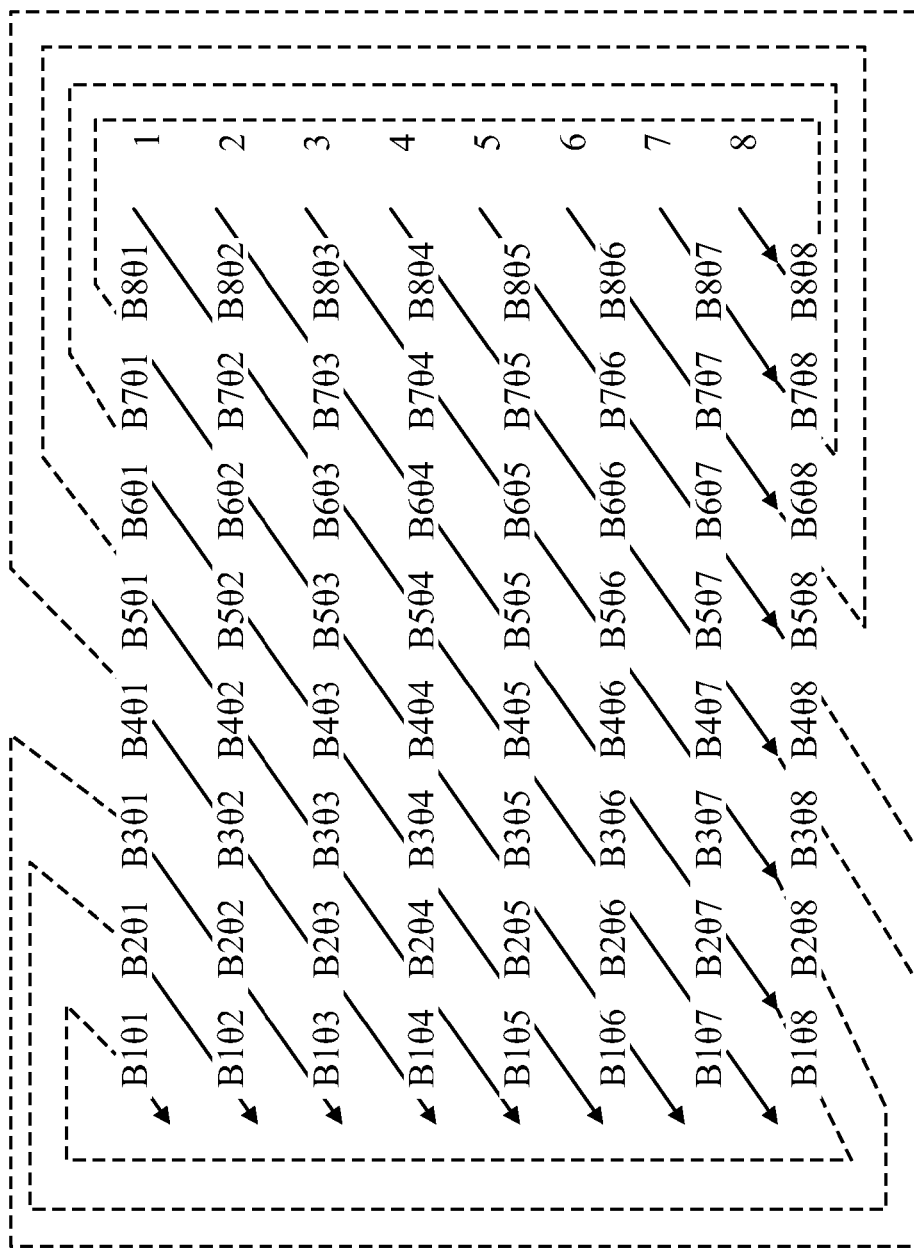

The simultaneous scanning of the field and rotating the gradients, in accordance with the embodiments of the present invention, to collect the elements of the Bθ matrix, represented by the slanting arrow direction in FIG. 2 is described below. Since it is desired to speed up the collection of projection data, rapid scan and rotating gradients are combined with direct detection, without the use of low frequency modulation, and phase sensitive detection. This leads to absorption profiles (rather than the first derivative obtained in phase sensitive detection). While this can introduce a reduction in the sensitivity of detection, it can be somewhat compensated by the fact that the profile intensity in absorption mode is an order of magnitude higher than in the first derivative mode.

In relation to the data collection strategy, when one looks along the diagonal of the matrix, it can be seen that both the field and the gradients are monotonically increasing. The spatial resolution can be determined by the digitization of one full sweep of the required region of the field by a rapid scan and into 64 or 128 steps (in the example this is will be in 8 steps) for a given magnitude of the gradient. During the field scan, synchronous rotation of the gradient vector can be made from 0-360° and the collected data will then be the elements of the diagonal of the Bθ matrix. This can be followed by scanning the field from high to low still rotating the gradient from 0-360°. This scanning from high to low can be preferable since the scanning does not jump from the high end of the field to the starting field abruptly, but is performed in a zigzag manner. The detected signals will now fill the elements of the Bθ matrix along the anti-diagonal from top to bottom. The other elements are also filled along lines parallel to the diagonal or the anti-diagonal of the Bθ matrix, and in order to accomplish this an incremental phase shift to the gradient rotation for each pair of upward and downward field scan can be imparted, as shown in FIGS. 2, 4-7. The mnemonic ways in which the matrix elements are acquired in the three modalities are depicted in FIG. 8.

Instrumentation for Rapid Scan Rotating Gradient CW EPR

The combined CW EPR imaging with rapid scan of the magnetic field and rotating gradients in accordance with the embodiments of the present invention cannot be performed using the conventional CW EPR spectrometer that only allows fixed gradients, and slow sweep of the magnetic field. The rapid scan envisaged in this modality requires a secondary sweep coil supplementing the Zeeman field, which can produce a small scan range that covers the spectral range of the object in presence of the gradients. For rapid field scan a pair of Helmholz coils were designed and placed very close to the resonator with its axis parallel to the Zeeman field, and the fast sweep was accomplished by using a low frequency (1-20 kHz) AC current that produces magnetic field amplitudes of 50-100 Gauss, corresponding to nearly 50-100 T/s sweep rates, which is capable of sweeping 50 G in just 50 to 100 μs. In one experiment, a very low frequency of 0.3 kHz, and a peak field amplitude of 26 Gauss corresponding to a field scan rate of 0.9 T/sec was used.

In addition, circularly polarized gradient currents are provided whose phase can be adjusted arbitrarily. By generating sinusoidal (AC) fields of identical amplitude and applying them to a pair of orthogonal gradient coils, the sum, (cos ωt+i sin ωt), will be circularly polarized. Since it is desired to perform one complete rotation of the gradient during the linear regime of the sinusoidal rapid scan, it is preferable to have the gradient rotation frequency be 3 or 4 time higher than the frequency of the AC magnetic field that provides the rapid scan.

Figure 7:
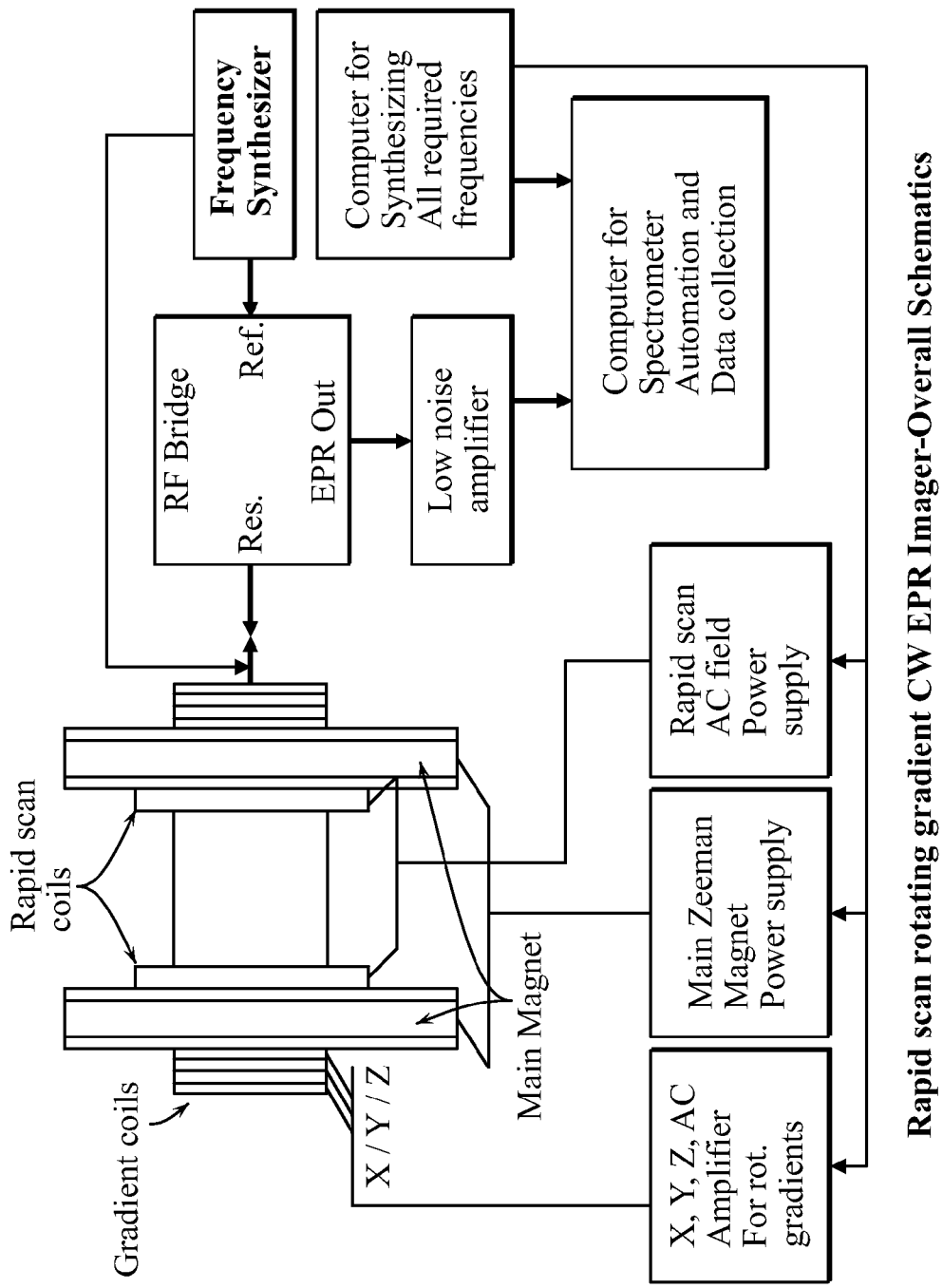
FIG. 7 is a simplified exemplary schematic diagram of the overall imaging system and its component sub-units in accordance with one embodiment of the present invention.

As described above, the rapid scan modality involves the direct detection of the EPR signals by mixing the signal output from the RF Bridge to the base band signal, amplifying the signal with video amplifiers, and digitizing the same at 50-100 Ms/s rate. The resonator (e.g., see Devasahayam et al. 2000) and the magnet/gradient coils system of a 300 MHz CW EPR spectrometer (Koscielniak et al. 2000) were employed for the rapid scan rotating gradient imaging experiment. The various sub components of the rapid scan rotating gradient CW imager are described as follows. FIG. 7 is an exemplary schematic diagram of the overall rapid scan rotating gradient spectrometer in accordance with one embodiment of the present invention. It includes the modules of a conventional CW EPR spectrometer/imager with the exception of the low frequency modulation system and the lock-in amplifier that is used to perform phase sensitive detection. The modulation coil is replaced by a low frequency (1-20 kHz) AC magnet coils that allow the application of either sinusoidal or triangular currents corresponding to rapid field sweep in the range +/−50 G. The gradient coils are also powered by alternate current, and are appropriately tuned to operate at selectable frequencies in the range 1-60 kHz. The signals at resonance are detected directly using the RF Bridge and down-converting the ESR signal to base band without field modulation. A personal computer with digital signal processing boards is used to generate phase coherent low frequencies for rapid sweep and rotating gradients. The signals are amplified using a low frequency amplifier with a selectable range of low pass filters and are directly acquired and averaged as absorption signals. The acquisition computer is programmed to reorganize the pseudo projections collected under the simultaneous rotation of the gradients and sweep of the Zeeman field to generate the proper projections. This can also perform the filtered back projection to yield spatial as well as spectral-spatial images.

The Rapid scan coils include a pair of Helmoholz coils of 50-60 turns of silvered copper wire of 15 cm average diameter, and positioned coaxial to the main Zeeman field with the coils close to the parallel coil resonator. These set of coils can be powered by a tunable amplifier that can provide magnetic field up to 100 G in selectable range of frequencies from up to 40 kHz. The amplifier accepts an input of up to 5 Volt peak-to-peak and can generate a sinusoidal field sweep of up to 100 G. The near-linear portion of the downward and upward swing of the sinusoid was capable of providing fast scans of up to 60 G. In one experiment, a 25 G linear scan range was accomplished at a sweep rate of 0.9 T/sec. The scan speed and the scan range can be adjustable with the frequency and amplitude of the sinusoidal input to the AC amplifier that powers the sweep coils.

The set of orthogonal x, y and z gradient coils embedded in a CW EPR system (e.g., see Koscielniak et al. 2000) that was used for DC gradients in conventional experiments, were tuned by varying the capacitance so as to provide distortion free currents of up to 6-7 Amp. at a frequency of 1 kHz with a input voltage amplitude of 2-3 Volts.

The detection scheme was modified such that the output signal from the RF bridge was mixed down to base band using a double balanced mixer with input from the reference atm after suitable amplification and/or attenuation. The amplification and/or attenuation was accomplished by adjusting the resonator coupling (e.g., matching and tuning of the transmitter to the resonator) and the phase of the reference input and amplifying the output of the mixer with a video amplifier (e.g., a Stanford Research Systems SR560 Low Noise amplifier with a 1 MHz low pass filter) capable of providing a gain of 5000.

For the digital generation of rotating gradients and rapid scan field sweeps, the field sweep AC signals and the frequency sweep AC signals as well as trigger signals for data acquisition were generated digitally by using a Labview® DSP board, which is capable of being programmed to provide up to 10 V peak-to-peak of a low frequency sinusoid and three high frequency sinusoids, as well as digital pulses that can be used as acquisition trigger. The range of frequencies of the low frequency was up to 10 kHz, and that of the high frequency was 30 kHz. The phases of the three high frequency outputs can be altered in programmed manner and had a specific relation to the low frequency sinusoid. For two dimensional imaging, for example for images parallel to the x and z axes, the x and z gradient outputs were 90 degree out of phase, and executed three full cycles per cycle of the low frequency rapid scan field. The amplitudes of the x and z gradient inputs could be adjusted such that the peak amplitudes of the magnetic field gradients in the two coils are equal so as to provide a circularly polarized (rotating) gradient field that consists a vector in the xz plane rotating at a frequency that can be selected at will. The x and z gradient frequencies (which were in quadrature) could be changed in a programmed manner to increment their phases step-wise at desired equal intervals, all the time maintaining their mutual orthogonality.

For data acquisition, the EPR signals from the low noise amplifier were captured using a commercially available digitizer-summer Acqiris AP100 dual channel Signal averager (Acqiris USA, Monroe, Calif.) capable of sampling up to 500 Ms/s per channel, and summing in real time with external time base and trigger inputs. The Acqiris signal averager could be programmed to fully automate the signal collection.

Results of Imaging Experiments on Phantoms with Rapid Scan and Rotating Gradients In order to demonstrate the functionality of simultaneous field scan and gradient rotation, 2D measurements on two point phantoms (consisting of two capillary tubes containing 1-2 mg of the stable paramagnetic compound the N-methylpyridinum Tetracyanoquinodimethane (TCNQ)) which gives a sharp exchange narrowed single EPR line were conducted. By placing the two tubes perpendicular to the Zeeman field (z-axis of the Zeeman field being parallel to the axis of the tubes) inside the parallel coil resonator, the AC sweep field alone was first applied. For each cycle of the AC sweep through resonance there was a single narrow EPR line. By adjusting the center field from the main magnet such that there was one resonance line when the maximum amplitude and the minimum amplitude from the sinusoidal field plus the Zeeman field matched the resonance condition, the sweep size was estimated and by moving the Zeeman field position exactly in between the two values, it was ascertained that the resonances occur in the middle of the up and down sweeps of the rapid scan sinusoids, giving two sharp lines per cycle of the sweep field.

By switching on the gradient coils one would normally see the splitting of the resonances, but because the gradients (here x and z gradients) are oscillatory, the patterns are not as easy to interpret. By using a pickup coil and orienting the same perpendicular to the x and z axes of the gradient axis coordinates and adjusting the amplitude of the x and z-axis input voltage, the gradients coils could be calibrated to provide equal magnitude of field amplitudes. In presence of the space encoding rotating gradients the resonance lines undergo splitting and are simultaneously subject to both field sweep and gradient sweep. In order to collect the signals as a function of the field sweep and gradient sweep, a trigger pulse was generated at a predetermined delay from the peak of the low frequency sinusoid. Once the trigger pulse activated the Acqiris digitizer, it continued acquiring a pre-selected number of signal points, and repeatedly did so to provide the pseudo projections. It should be realized that depending upon the acquisition time and the acquisition interval chosen, one could end up collecting several projections representing sweeps that alternatively change their direction (low field to high field or high field to low field). With the frequencies of the sweep and gradients respectively at 333.33 and 1000 Hz, 25,000 points at a sampling rate of 4 Ms/s were sampled, which correspond to, two full cycles of the sweep leading to two pairs of signals for the up field and downfield seeps (FIG. 9). Based on the signal to noise ratio, one can average 1-100 spectra. In one case 100 signals were averaged, per gradient phase. Once the averaging of the predetermined number of spectra had been completed, the phase of the x and z rotating gradients were advanced by an increment $\theta$, and the spectra were averaged again. This process was continued until the phases had been systematically incremented through $\theta$ steps from 0 to 360-$\theta$. By doing this all the required "pseudo projections" that represent the matrix elements parallel to the diagonal or anti-diagonal of the B$\theta$ matrix (FIGS. 6 A&B) were collected. Each spectrum at a given acquisition interval lasting for a time which is equal to one full cycle time of the gradient rotation, centered around the spectral position corresponding to the zero-gradient spectrum, forms a pseudo projection (FIG. 10) which should be reorganized to lie parallel to the diagonal or anti-diagonal (depending on the sense of the sweep) of the final B$\theta$ matrix by a simple matrix manipulation. Once this was done, what remained was to perform the known filtered back projection to obtain the images. Once the matrix manipulations had been carried out, the required portion of the projections could be chosen, and, if needed, the data interpolated to improve the digital resolution.

Figure 11:
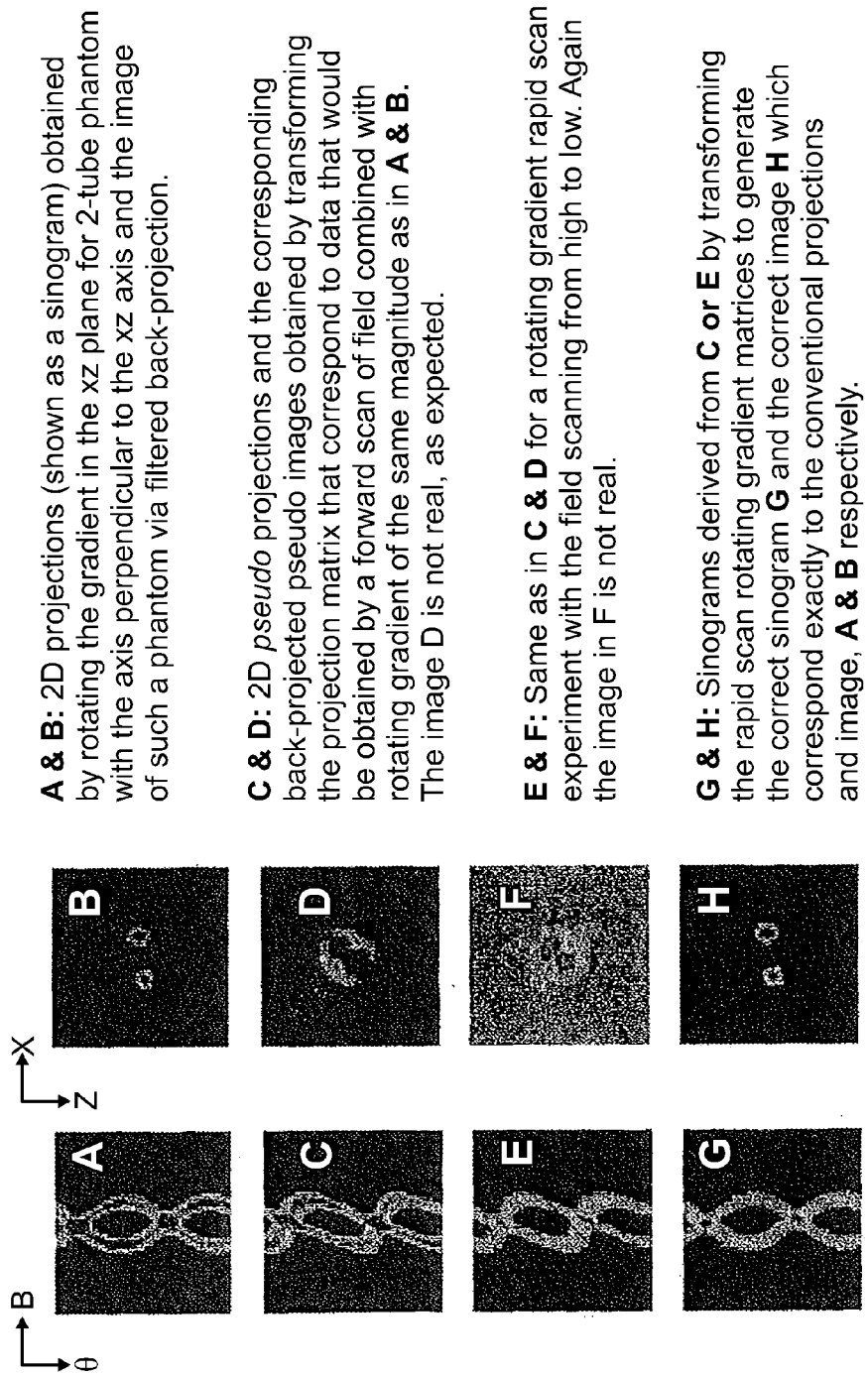
FIGS. 11A-H are exemplary projections corresponding to the data collection of FIG. 10.
Figure 15C:
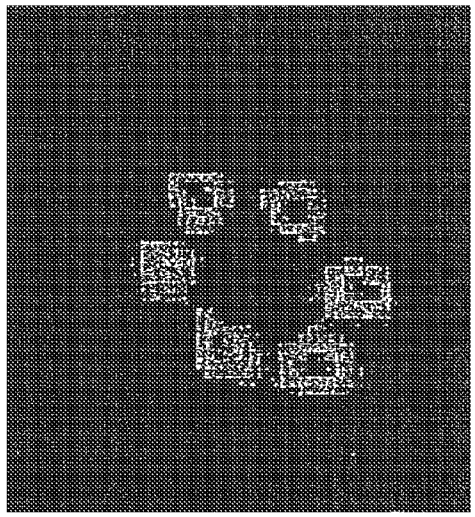
Figure 15B:
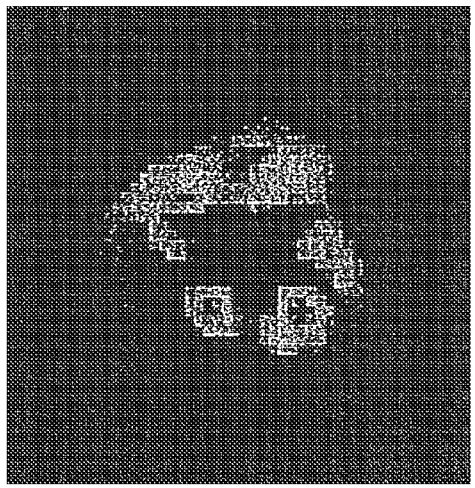
Figure 15A:
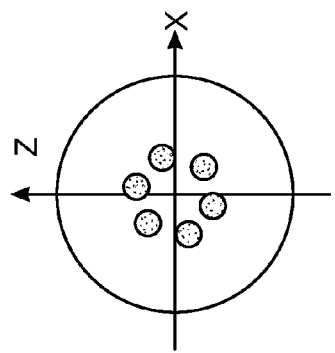

The way in which conventional projections were transformed into pseudo projections by simultaneous rapid field scan and rotation of gradients and how these were reconverted to normal projections, before back-projection were simulated using the radon transform and filtered back-projection programs. The simulations are shown in FIGS. 11 and 12. Results obtained on the phantoms that are summarized in FIGS. 13-15 clearly demonstrate the feasibility of the simultaneous rapid scan and field gradient rotation in CW EPR imaging. While the above example was a 2D example, it can be extended to three dimensions, by the additional tilting of the plane of the rotating gradients with respect third gradient axis, and manipulating the resulting pseudo projection matrices.

The following are to be considered when employing such a rapid-scan rotating gradient CW EPR imaging as a routine imaging modality. These include:

(a) the SNR of the rapid scan EPR signals should be optimized by choosing an appropriate low-noise amplifier having a proper bandwidth and gain factor;

(b) the gradient coils need to be tuned and calibrated under the AC current so that the gradients are truly circularly polarized without any elliptical components;

(c) ultra rapid scans, which may seldom be used, may lead to FID-like ringing, and these have to be removed by correlation corrections;

(d) solenoidal resonators may act as a good antenna for the oscillatory gradients and can lead to sinusoidal base-line artifacts (as can be seen in FIG. 13) that have to be removed by at polynomial base-line correction programs—the use of alternate resonators such as loop-gap resonators may largely limit such base-line artifacts; and (e) the scan speed needs to be optimized keeping in mind the increased bandwidth to be detected due to the rapid scan, as well as the increased presence of FID-like ringing artifacts, although the latter can be removed by Fourier deconvolution methods.

As described above, CW EPR images can be produced at speeds that match with Time-domain methods, and yet may use RF power levels that are several orders of magnitude lower. Furthermore, the availability non-toxic narrow-line compounds such as those based on triarylmethyl radical, make CW EPR quite a viable approach for quantitative estimate of tissue oxygenation, temporally well-resolved estimates of redox status and investigations of tumor physiology.

The present disclosure is also directed toward certain further innovations in the implementation of the digital signal processing, field programmable gate array implementation, and software or computer-based methods for the control, signal processing, and automation of the CW imaging with rapid scan and rotating gradients. In particular, these aspects include a Gradient Controller Unit for signal processing implementation, computer-based methods for control and data acquisition, and a digital receiver for a Field Programmable Gate Array (FPGA) implementation. Each of these aspects is described below in further details.

DSP Based Gradient Controller

The gradient controller, in accordance with the embodiments of the present invention can be designed around a Field Programmable Gate Array (FPGA) integrated circuit (e.g., Virtex4 manufactured by Xilinx, Inc). The internal functionality of this IC is defined in a code which resides in external program memory and is uploaded when the system starts. The memory contains several versions of the program defining 2D and 3D imaging procedures such as the gradient rotation frequency and the sweep frequency, the number of projections for image reconstruction required for optimizing the image quality in terms of signal to noise ratio, the number of samples in each projection, etc. In one exemplary embodiment, a particular set of measurement parameters can be selected by a thumbwheel switch located in the front panel (described below) of the gradient controller to perform image data acquisition at the desired speed and resolution.

Figure 16:
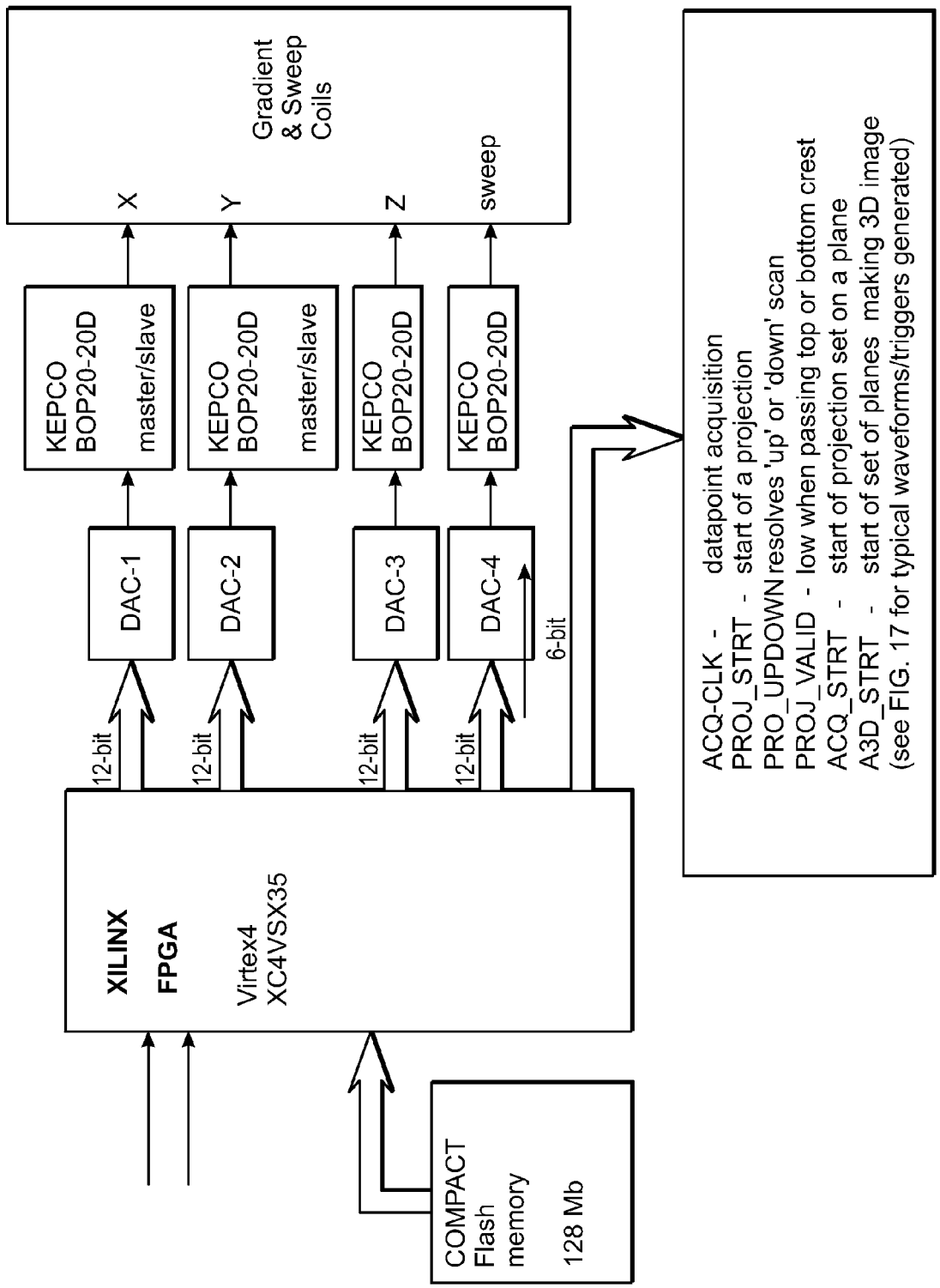
FIG. 16 is a block diagram of gradient controller of the rapid scan imaging system, in accordance with one embodiment of the present invention.

In one specific implementation, the FPGA integrated circuit produces four digitally synthesized sinusoidal voltages which drive inputs of a current amplifiers (e.g., KEPCO BOP20-20D) which in turn control currents in XYZ gradients and sweep coils of the imaging magnet. In addition to amplifier control, six additional digital signals provide accurate acquisition timing and memory addressing. Further details are illustrated in FIG. 16, which is a block diagram of gradient controller of the rapid scan imaging system, in accordance with one embodiment of the present invention. As is shown in FIG. 16, the Virtex4 XC4VSX32 IC drives four 12-bit DA converters which control currents in XYZ gradient and sweep coils producing rotating gradients. Additionally six digital signals provide accurate timing and memory addressing of the data acquisition process.

Figure 17:
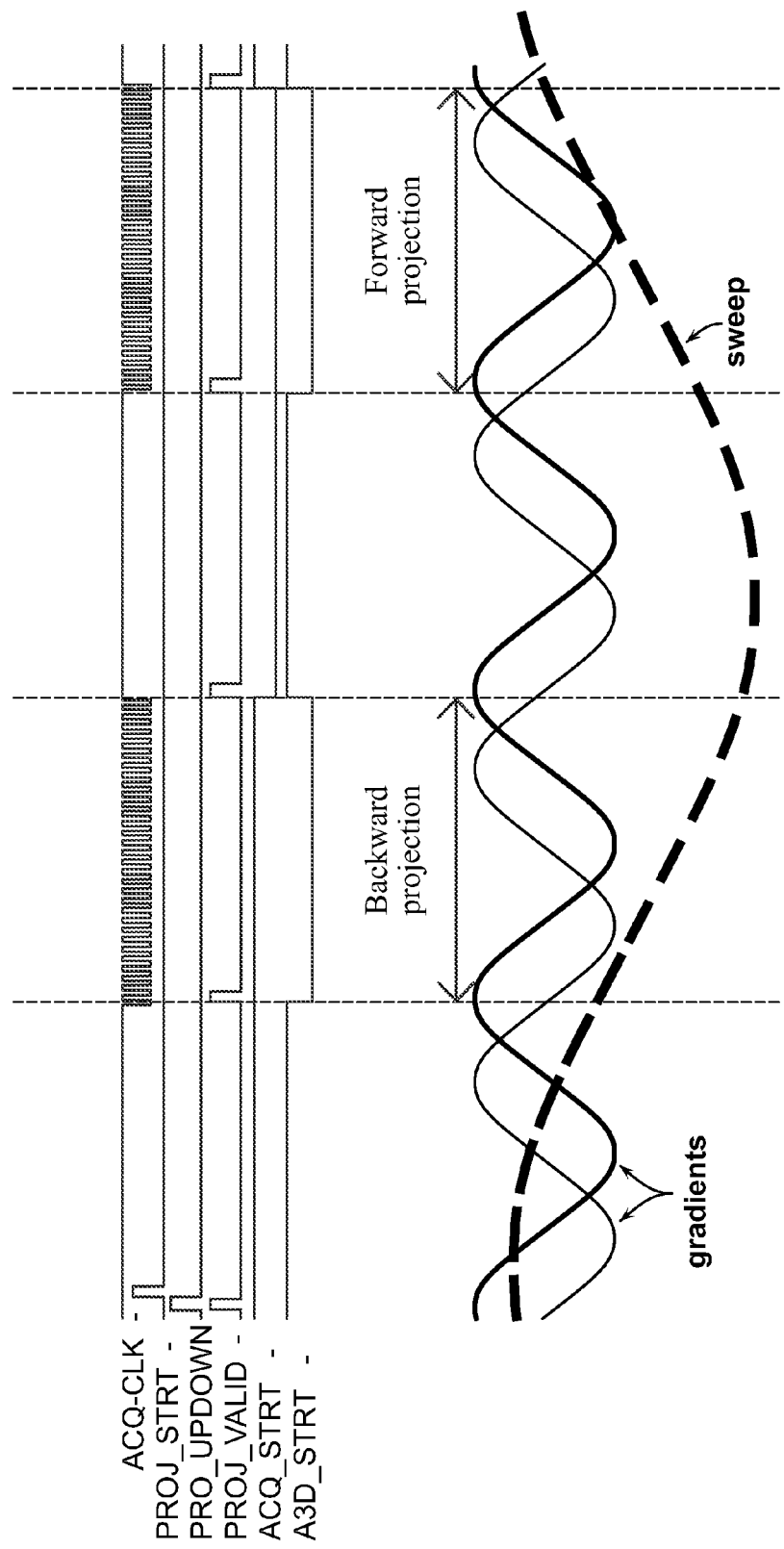
FIG. 17 illustrates the typical waveforms/triggers generated by the gradient controller of FIG. 16.

FIG. 17 shows the typical waveforms/triggers generated by the gradient controller of FIG. 16. As is illustrated by FIG. 17, the gradient and sweep control unit generates the low frequency sweep currents, the higher frequency gradient currents and generates all the timings (triggers) required to acquire the projections along the up field and downfield swing of the sweep sinusoid. Two projections are acquired for every sweep cycle, and stored separately. They can be combined during the back projection step. The frequency of gradient rotating signal is limited by amplifiers' ability to generate high AC voltages across a gradient coil. It should be noted that with the KEPCO BOP20-20D based amplifier set and current gradient coils, the maximum frequency is about 5 kHz, however, by switching to a larger amplifier set, this frequency can be increased to 10 kHz and hence double the acquisition speed. Using the gradient controller of FIG. 16 with the typical waveforms of FIG. 17, acquisition times for most frequently used 64-point resolution is as follows: for a Single 64 point projection: about 205 µs; for a 2D image 64×64: about 52.4 ms; and for a 3D image 63×64×64: about 3.35 s.

Data Acquisition

In one implementation, for data acquisition, the EPR signals from the low noise amplifier can be captured using a commercially available data acquisition system. The National Instruments PCI-6281 (National Instruments, Austin, Tex.) is capable of sampling up to 625 ksamples/s with external time base and trigger inputs. The National Instruments device can be programmed with National Instruments LabVIEW software to fully automate the signal collection and processing.

Figure 18:
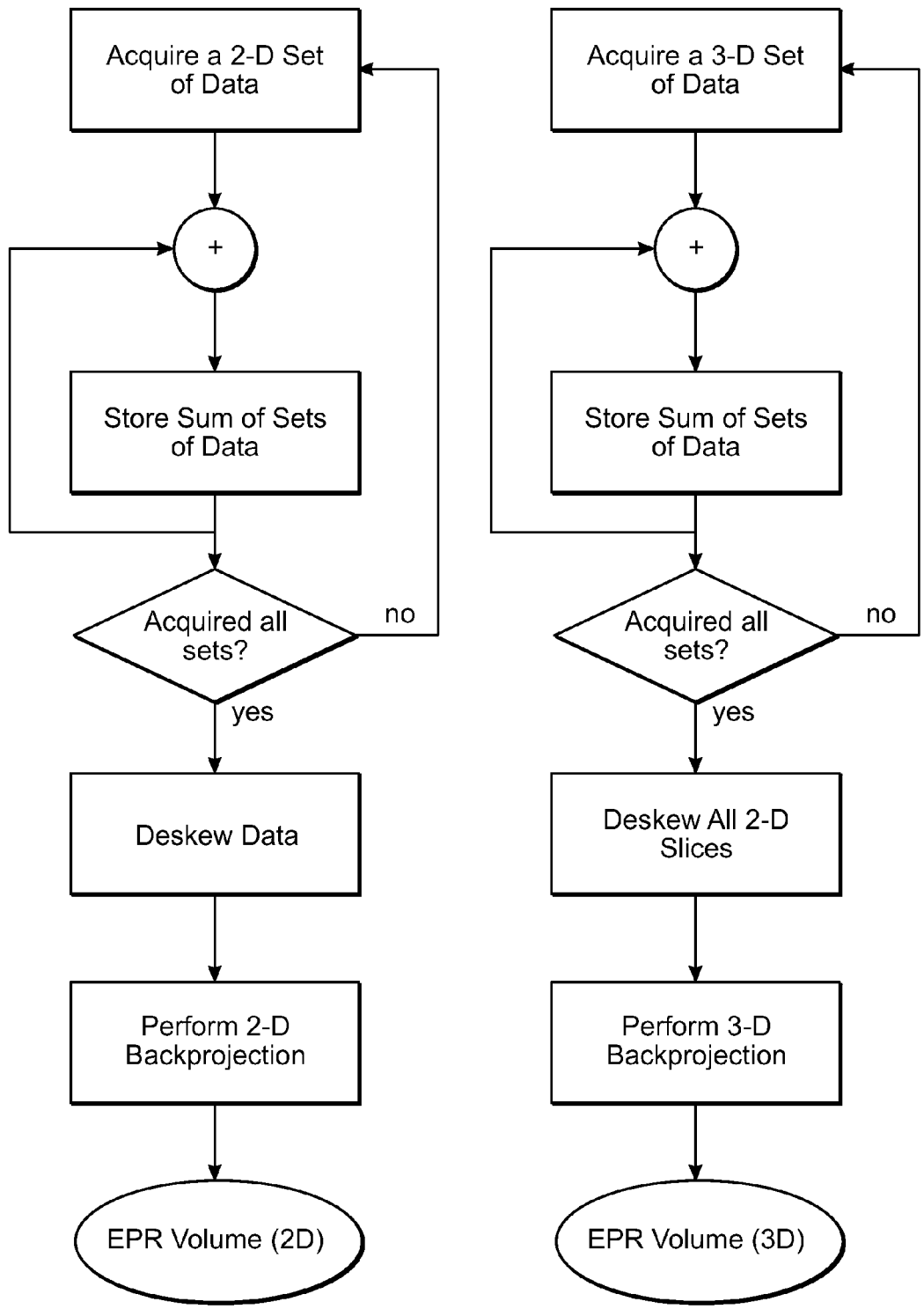
FIG. 18 is a flow chart of the 2D/3D data acquisition and processing in accordance with one embodiment of the present invention.

The data acquisition software allows the collection of 2-D and 3-D sets of projections. Multiple sets of either 2-D or 3-D data can be acquired and averaged together. The hardware is configured to respond to external trigger and clock signals to synchronize the acquisition of each set. This arrangement can improve the signal-to-noise ratio (SNR) of the data and ultimately improve the quality of the final images. FIG. 18 shows a flow chart of the 2D/3D data acquisition and processing in accordance with one embodiment of the present invention. As can be seen in FIG. 18, once the desired number of sets is collected, the data is then processed with a deskewing algorithm that results in the set of sinograms. These sinograms are transformed into an image or volume by applying the a standard back-projection algorithm.

Due to the rotating nature of the gradient and sweep signals, two sets of projections can be acquired in parallel. One set can be acquired on the rising slope of the sweep signal and another set can be acquired on the falling slope of the sweep signal. Each of these sets can be processed in parallel and the final images or volumes can be averaged together for additional SNR improvement.

Hardware-Based Averaging Receiver (DSP Receiver)

Figure 19:
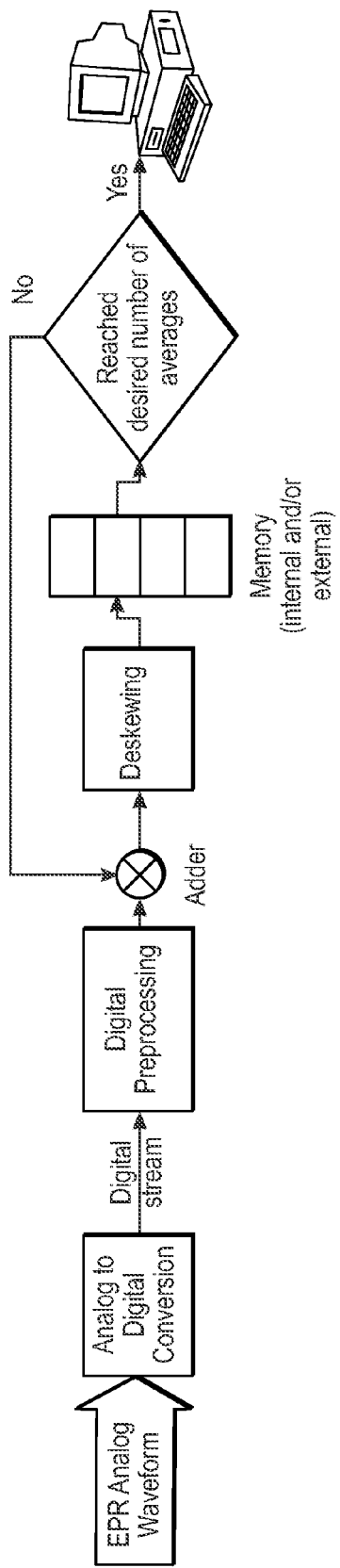
FIG. 19 is a simplified schematic diagram of the hardware-based DSP receiver, in accordance with one embodiment of the present invention.

FIG. 19 shows a simplified schematic diagram of the hardware-based DSP receiver, in accordance with one embodiment of the present invention. As can be seen in FIG. 19, one implementation of a hardware-based averaging receiver allows a user set number of averages for the incoming waveform. Using a field programmable gate array (FPGA) the waveform samples are preprocessed and then stored in memory. Subsequent waveform samples are added to the previous samples to foam a running sum of the waveform. The memory in which the waveform samples are stored can either be external or internal to the FPGA device. Digital control signals supplied to the FPGA are used to select the valid samples and allow de-skewing of incoming waveform prior to summation and storage in memory. Once the specified number of averages is reached, the averaged waveform is sent to the control computer.

For this real-time data acquisition and averaging implementation, the EPR signals from the low noise amplifier can be captured using a data acquisition device such as the commercially available XtremeDSP PCI based board (Nallatech Inc, Eldersburg, Md.) with the BenADDA daughterboard. The BenADDA board is equipped with analog to digital converters capable of sampling up to 105 Msamples/s. The samples are passed on to the XtremeDSP main board which has a Virtex-4 Xilinx FPGA. The design on the FPGA takes in the waveform samples and averages the waveform the user-requested number of times, taking into account skewing. The host PC in which the XtremeDSP board is installed, communicates to the board with drivers supplied by Nallatech. Software, which can be written in LabVIEW (National Instruments, Austin, Tex.) allows the user to control the acquisition, and set the number of averages, among other parameters. Once the number of averages is reached, the averaged wave form samples are passed on to the host PC, and acquisition of the next waveform starts.

Graphical User Interface

Another aspect of the present disclosure is directed to the development of a Graphical User Interface (GUI) to allow for a user friendly operation of the spectrometer and its associated imager. In one implementation a Labview based GUI is developed. It should be realized that the GUI is not limited to a Labview-based one and that other software platforms may be used to implement the GUI to have the functionally described below.

Figure 20:
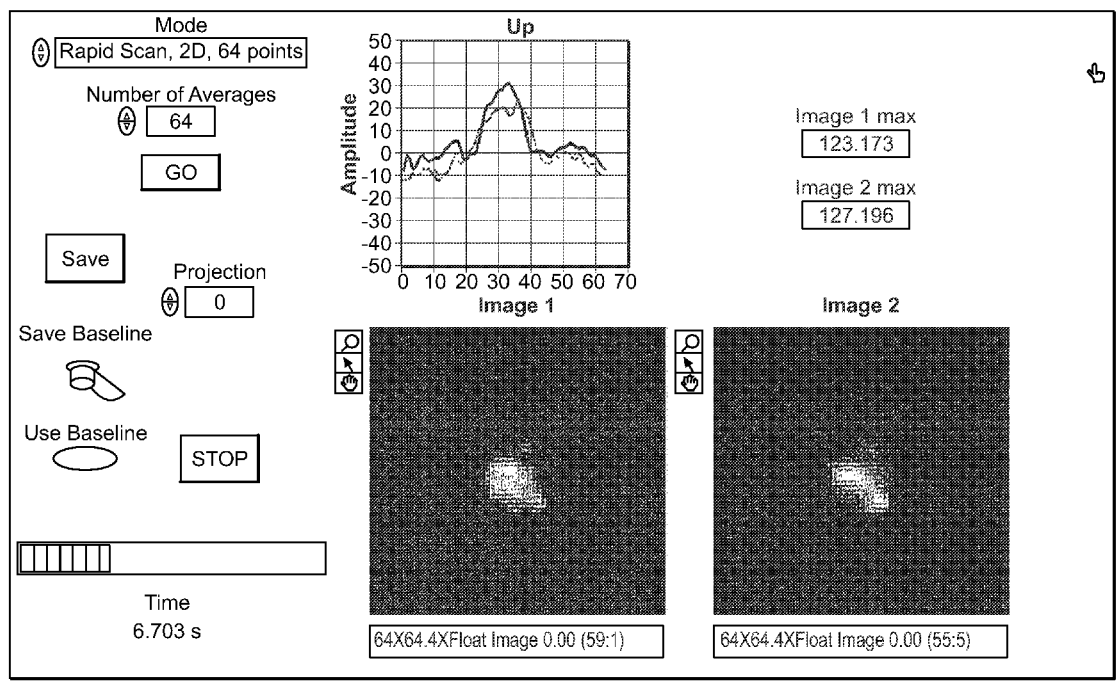
FIG. 20 illustrates the Graphics User Interface (GUI) of the CW imaging with rapid scan and rotating gradients in accordance with one embodiment of the present invention.

FIG. 20 shows the GUI of the CW imaging with rapid scan and rotating gradients in accordance with one embodiment of the present invention. As can be seen in FIG. 20, the choice of the particular 2D or 3D imaging scheme is selected four a pull-down menu and the corresponding imaging mode is set by thumbwheel control on the gradient controller. This is followed by front panel entry of the number of averages. Upon starting the data collection by a mouse click, the computer program sets all the parameters and starts the acquisition and upon the completion of the acquisition, it automatically unskews the projections and performs 2D or 3D back-projection, as described above. The images (in the case of 2D) and selected slices (in the case of 3D) can be displayed almost immediately following the data collection. The data are also stored in the computer for archiving. Referring to FIG. 20, the selection of the particular mode of imaging (2D or 3D), the number of averages per projection, the display of the projections for the upward and downward sweep of the sinusoid, the back-projected images from both scans and the total time of measurement, etc., can be seen. This particular measurement is that of an SCC (squamous cell carcinoma) tumor on one of the legs of a C3H mouse.

The embodiments of the present invention enable the fastest way for CW EPR imaging. With this very fast CW EPR imaging, one can see changes of blood perfusion and oxygenation in tumors in almost real time. With improved resolution, the methods of the present invention will enable looking at angiogenesis in and around tumors in a non-invasive manner. Rapid scan imaging can provide excellent temporal resolution and can help quantify pharmaco-kinetics and metabolic degradation kinetics of bioactive free radicals, nature of tissue redox status during ischemia and reperfusion, etc. The strategy as disclosed above is also applicable in any magnetite resonance spectroscopy and imaging scenario, and as such would be equally applicable to perform rapid measurements in nuclear magnetic resonance, NMR, magnetic resonance imaging, MRI, as well as nuclear quadrupole resonance spectroscopy and imaging, NQR.

Figure 21A:
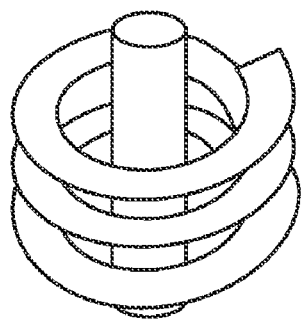
FIG. 21A is a simplified diagram of a phantom and FIG. 21B shows two different surface-rendered 3D-perspectives from the rapidscan-rotating gradient CW images.
Figure 21B:
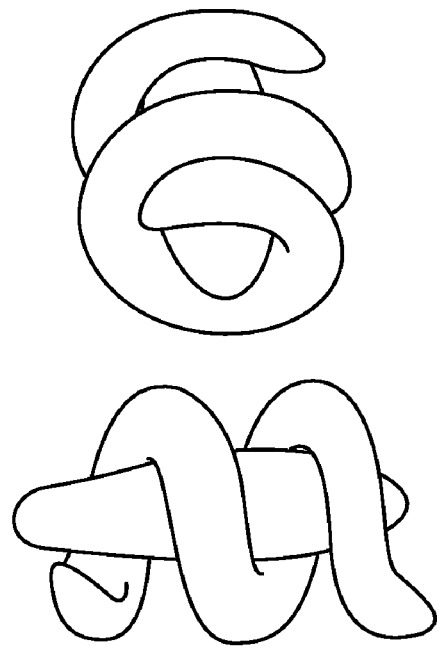

FIG. 21 shows a 3D-image of a phantom consisting of a nylon tubing (~2 mm i.d.) in the form of a spiral and a central tube (~4 mm i.d.) filled with 3 mMOxo63. The gradients were at a frequency of 4.8 kHz and the field sweep was with a sinusoid at 1.2 kHz. 64 azimuthalangular steps per gradient cycle, and 64 polar tilts corresponding to 4096 projections were carried out without any signal averaging. The total measurement time was 6 sec., likely to be the fastest so far in 3D volume imaging by any magnetic resonance modality.

All patents, patent applications, publications, and descriptions mentioned above are herein incorporated by reference in their entirety for all purposes. None is admitted to be prior art.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. And, as will be understood by those skilled in the art, the present invention may be embodied in other specific forms without departing from the essential characteristics thereof. These other embodiments are intended to be included within the scope of the present invention, which is set forth in the following claims.

What is claimed is:

1. An electron paramagnetic resonance imaging system, comprising:
   means for continuously irradiating a sample with RF irradiation;
   means for imposing on the sample a sinusoidally varying magnetic field along with rotating gradients for spatial encoding;
   means for directly detecting signal data from the sample, without using field modulation, while irradiating the sample with RF radiation continuously, said means for directly detecting having means for sweeping the sinusoidally varying magnetic field;
   a digital gradients and sweep controller operationally coupled with said means for imposing on the sample a sinusoidally varying magnetic field along with rotating gradients for spatial encoding, said means for directly detecting signal data from the sample, and said means for processing the signal data,
   said digital gradients and sweep controller configured to automatically maintain the relative speeds for the sweep current and the gradient currents and adjust the timing for detecting signal data; and
   means for processing the signal data, using means including a digital signal processor.

2. The system of claim 1, wherein said digital gradients and sweep controller comprises a Field Programmable Gate Array (FPGA) integrated circuit.

3. The system of claim 2, wherein said circuit is configured to produce a plurality of sinusoidal voltages which are used to drive a respective plurality of current amplifiers to control currents in the gradient and sweep coils of the imaging magnets of said electron paramagnetic resonance imaging system.

4. The system of claim 1, wherein said means for processing the signal data is configured to collect signal data including projection data and perform two-dimensional back projection to display the image data.

5. The system of claim 1, wherein said means for processing the signal data is configured to collect signal data including projection data and perform three-dimensional back projection to display a slice of image data.

6. The system of claim 1, wherein said means for processing the signal data is configured to acquire waveforms in real-time, and wherein said digital signal processor is configured for filtering and averaging said acquired waveforms.

7. The system of claim 6, wherein said means for processing the signal data comprises a Field Programmable Gate Array (FPGA) integrated circuit.

8. The system of claim 1 wherein said means for imposing a sinusoidally varying magnetic field is configured for having sinusoidally varying magnetic fields in two or three orthogonal axes so as to impose a rotating gradient in one or multiple planes onto the sample for the purpose of generating projections that can be used to reconstruct 2 and 3 dimensional EPR images or spectral spatial images.

9. The system of claim 1 wherein said means for sweeping are configured for magnetic field scans in a range from milliseconds to tens of microseconds.

10. The system of claim 1 wherein said means for directly detecting signal data are configured for mixing the signal data to the base-band signal and acquiring the same with a digitizer.

11. The system of claim 1 wherein said means for directly detecting signal data are configured for mixing the signal data to the base-band signal and further processing the signal data using digital signal acquisition and image processing modules.

12. The system of claim 1 wherein said means for continuously irradiating the sample with RF irradiation is configured to use a very low RF power on the order of a few milliwatts, wherein the specific absorption rate is substantially reduced, so as to facilitate large volume in vivo EPR spatial and functional imaging.

13. The system of claim 1 wherein said means for directly detecting having means for sweeping the sinusoidally varying magnetic field further comprises means for imposing static gradients in a Cartesian raster to perform constant time spectral spatial imaging (CTSSI) in two and three dimensions with improved temporal resolution.

14. The system of claim 8 wherein said means for imposing a sinusoidally varying magnetic field along with rotating gradients for spatial encoding, is configured to occur substantially simultaneously with said means for directly detecting signal data from the sample, wherein a pseudo real-time EPR imaging modality is achieved.

15. A method for performing electron paramagnetic resonance imaging using the electron paramagnetic resonance imaging system of claim 1, comprising:
   continuously irradiating a sample with RF irradiation;
   imposing on the sample a sinusoidally varying magnetic field along with rotating gradients for spatial encoding;
   directly detecting signal data from the sample, without using field modulation, while irradiating the sample with RF radiation continuously, wherein the step of directly detecting comprises sweeping the sinusoidally varying magnetic field;
   automatically maintaining relative speeds for sweep current and gradient currents and adjust timing for detecting signal data; and
   processing the signal data using a digital signal processor.

16. The method of claim 15 wherein the step of imposing a sinusoidally varying magnetic field comprises having sinusoidally varying magnetic fields in two or three orthogonal axes so as to impose a rotating gradient in one or multiple planes onto the sample for the purpose of generating projections that can be used to reconstruct 2 and 3 dimensional EPR images or spectral spatial images.

17. The method of claim 15 wherein the step of sweeping comprises performing magnetic field scans in a range from milliseconds to tens of microseconds.

18. The method of claim 15 wherein the step of directly detecting signal data comprises mixing the signal data to the base-band signal and acquiring the same with a digitizer.

19. The method of claim 15 wherein the step of directly detecting signal data comprises mixing the signal data to the base-band signal and further processing the signal data using digital signal acquisition and image processing modules.

20. The method of claim 15 wherein the step of continuously irradiating the sample with RF irradiation comprises using a very low RF power on the order of a few milliwatts, wherein the specific absorption rate is substantially reduced, so as to facilitate large volume in vivo EPR spatial and functional imaging.

21. The method of claim 15 wherein the step of directly detecting further comprises imposing static gradients in a Cartesian raster to perform constant time spectral spatial imaging (CTSSI) in two and three dimensions with improved temporal resolution.

22. The method of claim 16 wherein the step of imposing a sinusoidally varying magnetic field along with rotating gradients for spatial encoding occurs substantially simultaneously with the step of directly detecting signal data from the sample, wherein a pseudo real-time EPR imaging modality is achieved.

* * * * *

UNITED STATES PATENT AND TRADEMARK OFFICE
CERTIFICATE OF CORRECTION

PATENT NO.        : 8,242,778 B2                                             Page 1 of 1
APPLICATION NO.   : 12/794695
DATED             : August 14, 2012
INVENTOR(S)       : Subramanian et al.

It is certified that error appears in the above-identified patent and that said Letters Patent is hereby corrected as shown below:

Title Page, Item (75) Inventor is corrected to read:
-- Sankaran Subramanian, Rockville (MD);
   Nallathamby Devasahayam, Germantown (MD);
   Janusz Koscielniak, Frederick (MD);
   James B. Mitchell, Damascus (MD);
   Murali K. Cherukuri, North Potomac (MD);
   Thomas J. Pohida, Frederick (MD);
   Randall Pursley, Gaithersburg (MD);
   Ghadi Salem, Silver Spring (MD) --.

Signed and Sealed this
Sixth Day of October, 2015

Michelle K. Lee
*Director of the United States Patent and Trademark Office*